(12) United States Patent
Bessems et al.

(10) Patent No.: US 9,563,132 B2
(45) Date of Patent: Feb. 7, 2017

(54) FLUID HANDLING STRUCTURE, A LITHOGRAPHIC APPARATUS AND A DEVICE MANUFACTURING METHOD

(75) Inventors: David Bessems, Eindhoven (NL); Erik Henricus Egidius Catharina Eummelen, Eindhoven (NL); Michel Riepen, Veldhoven (NL); Rogier Hendrikus Magdalena Cortie, Ittervoort (NL); Adrianes Johannes Baeten, Eindhoven (NL); Cornelius Maria Rops, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 729 days.

(21) Appl. No.: 13/564,210

(22) Filed: Aug. 1, 2012

(65) Prior Publication Data

US 2013/0033692 A1    Feb. 7, 2013

Related U.S. Application Data

(60) Provisional application No. 61/515,602, filed on Aug. 5, 2011.

(51) Int. Cl.
*G03F 7/20* (2006.01)

(52) U.S. Cl.
CPC ...... *G03F 7/70341* (2013.01); *Y10T 137/2931* (2015.04)

(58) Field of Classification Search
CPC ................................................. G06F 7/70341
See application file for complete search history.

(56) References Cited

U.S. PATENT DOCUMENTS

| 4,509,852 | A  | 4/1985  | Tabarelli et al. |
|-----------|----|---------|------------------|
| 6,952,253 | B2 | 10/2005 | Lof et al.       |
| 7,081,943 | B2 | 7/2006  | Lof et al.       |

(Continued)

FOREIGN PATENT DOCUMENTS

| CN | 1821884    | 8/2006 |
|----|------------|--------|
| CN | 101403862  | 4/2009 |

(Continued)

OTHER PUBLICATIONS

U.S. Appl. No. 61/506,442, filed Jul. 11, 2011, Rogier Hendrikus Magdalena Cortie et al.

(Continued)

*Primary Examiner* — Toan Ton
*Assistant Examiner* — Michelle M Iacoletti
(74) *Attorney, Agent, or Firm* — Pillsbury Winthrop Shaw Pittman LLP

(57) ABSTRACT

A fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; a gas supply opening at least partly surrounding and radially outward of the meniscus pinning feature; and optionally a gas recovery opening radially outward of the gas supply opening, wherein the gas supply opening, or the gas recovery opening, or both the gas supply opening and the gas recovery opening, has an open area per meter length which has a variation peripherally around the space.

20 Claims, 10 Drawing Sheets

(56) References Cited

U.S. PATENT DOCUMENTS

| | | |
|---|---|---|
| 7,372,541 B2 | 5/2008 | Lof et al. |
| 7,388,648 B2 | 6/2008 | Lof et al. |
| 7,705,962 B2 | 4/2010 | Kemper et al. |
| 2004/0207824 A1 | 10/2004 | Lof et al. |
| 2006/0038968 A1 | 2/2006 | Kemper et al. |
| 2006/0158627 A1 | 7/2006 | Kemper et al. |
| 2008/0192214 A1 | 8/2008 | Leenders et al. |
| 2008/0212046 A1 | 9/2008 | Riepen et al. |
| 2009/0161083 A1* | 6/2009 | Donders et al. ........ 355/30 |
| 2009/0279060 A1 | 11/2009 | Direcks et al. |
| 2009/0279062 A1 | 11/2009 | Direcks et al. |
| 2009/0279063 A1 | 11/2009 | Riepen et al. |
| 2010/0085545 A1 | 4/2010 | Direcks et al. |
| 2010/0313974 A1 | 12/2010 | Riepen et al. |
| 2011/0090472 A1 | 4/2011 | Riepen et al. |
| 2011/0134401 A1 | 6/2011 | Rops et al. |
| 2011/0188012 A1 | 8/2011 | Direcks et al. |
| 2011/0194084 A1 | 8/2011 | Riepen et al. |
| 2011/0199593 A1 | 8/2011 | Riepen et al. |

FOREIGN PATENT DOCUMENTS

| | | |
|---|---|---|
| EP | 1 420 298 | 5/2004 |
| JP | 2008-147652 | 6/2008 |
| JP | 2010-034555 | 2/2010 |
| JP | 2010-161383 | 7/2010 |
| JP | 2012-064974 | 3/2012 |
| WO | 99/49504 | 9/1999 |

OTHER PUBLICATIONS

Japanese Office Action mailed Sep. 2, 2013 in corresponding Japanese Patent Application No. 2012-158755.
Korean Office Action mailed May 30, 2013 in corresponding Korean Patent Application No. 10-2012-0085276.

* cited by examiner

FLUID HANDLING STRUCTURE, A LITHOGRAPHIC APPARATUS AND A DEVICE MANUFACTURING METHOD

This application claims priority and benefit under 35 U.S.C. §119(e) to U.S. Provisional Patent Application No. 61/515,602, filed on Aug. 5, 2011. The content of the foregoing application is incorporated herein in its entirety by reference.

FIELD

The present invention relates to a fluid handling structure, a lithographic apparatus, a method for manufacturing a device using a lithographic apparatus, and a method of operating a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. Instability in the meniscus can result in a bubble in immersion liquid which can lead to imaging errors, for example by interfering with a projection beam during imaging of the substrate.

It is desirable, for example, to provide a lithographic apparatus in which the likelihood of bubble inclusion is at least reduced.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; at least one gas supply opening at least partly surrounding and radially outward of the meniscus pinning feature; and optionally at least one gas recovery opening radially outward of the gas supply opening(s), wherein the gas supply opening(s), or the gas recovery opening(s), or both the gas supply opening(s) and the gas recovery opening(s), have an open area per meter length which has a variation peripherally around the space.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; at least one gas supply opening at least partly surrounding and radially outward of the meniscus pinning feature; and optionally one or both of (a) at least one gas recovery opening radially outward of the gas supply opening(s), and/or (b) at least one immersion fluid supply opening radially inward of the meniscus pinning feature; wherein a distance between at least one selected from the following: (i) a line passing along the immersion fluid supply opening(s) and a line passing along the meniscus pinning feature; (ii) a line passing along the meniscus pinning feature and a line passing along the gas supply opening(s); and (iii) a line passing along the gas supply opening(s) and a line passing along the gas recovery opening(s), varies peripherally around the space.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space, wherein the meniscus pinning feature has, in plan, a cornered shape with a low radius part with a first radius of curvature at a corner and a high radius part distant from the corner with a second radius of curvature which is higher than the first radius of curvature, and a contact angle of immersion liquid to the fluid handling structure in a region at the low radius part is lower than the contact angle of immersion liquid to the fluid handling structure in a region at the high radius part.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; and optionally at least one selected from the following: (a) at least one gas supply opening at least partly surrounding and radially outward of the meniscus pinning feature; (b) at least one gas recovery opening radially outward of the gas supply opening(s); and/or (c) at least one immersion fluid supply opening radially inward of the meniscus pinning feature, wherein the meniscus pinning feature has, in plan, a cornered shape with a low radius part with a first radius of curvature at a corner and a high radius part distant from the corner with a second radius of curvature which is higher than the first radius of curvature, and a fluid supply and/or recovery system configured to supply and/or recover fluid to/from at least one selected from the following: (a) the at least one gas supply opening, (b) the meniscus pinning feature, (c) the at least one gas recovery opening, and/or (d) the at least one immersion fluid supply opening, at a different rate at a peripheral position corresponding to the high radius part than to a peripheral position corresponding to the low radius part.

According to an aspect, there is provided a fluid handling structure for a lithographic apparatus, the fluid handling structure being configured to contain immersion fluid to a space, the fluid handling structure having in an undersurface: a plurality of fluid recovery openings at least partly surrounding the space to resist passage of immersion fluid in a radially outward direction from the space; and a meniscus pinning device extending between at least two of the plurality of fluid recovery openings.

According to an aspect, there is provided a device manufacturing method, comprising: projecting a patterned beam of radiation through an immersion liquid confined to a space between a projection system and a substrate; providing gas through at least one gas supply opening to a position adjacent a meniscus of the immersion liquid; and optionally recovering gas which passes through the gas supply opening(s) through at least one gas recovery opening radially outward of the gas supply opening(s), wherein one or both of the gas supply opening(s) and/or gas recovery opening(s) have an open area per meter length which has a variation peripherally around the space.

According to an aspect, there is provided a device manufacturing method, comprising: projecting a patterned beam of radiation through an immersion liquid confined to a space between a projection system and a substrate; providing gas through at least one gas supply opening to a position adjacent a meniscus of the immersion liquid, the passage of the meniscus being resisted by a meniscus pinning feature; and optionally one or both of: (a) recovering gas which passes through the at least one gas supply opening through at least one gas recovery opening radially outward of the at least one gas supply opening; and/or (b) providing immersion fluid to the space through at least one immersion fluid supply opening radially inward of the meniscus pinning feature, wherein a distance between at least one selected from the following: (i) a line passing along the immersion fluid supply opening(s) and a line passing along the meniscus pinning feature; (ii) a line passing along the immersion pinning feature and a line passing along the gas supply opening(s); and/or (iii) a line passing along the gas supply opening(s) and a line passing along the gas recovery opening(s), varies peripherally around the space.

According to an aspect, there is provided a device manufacturing method, comprising: projecting a patterned beam of radiation through an immersion liquid confined to a space between a projection system and a substrate; providing gas through an opening to a position adjacent a meniscus of the immersion liquid, the passage of the meniscus being resisted by a meniscus pinning feature, wherein the meniscus pinning feature has, in plan, a cornered shape with a low radius part with a first radius of curvature at a corner and a high radius part distant from the corner with a second radius of curvature which is higher than the first radius of curvature, and wherein a contact angle of immersion liquid to the fluid handling structure in a region at the low radius part is lower than the contact angle of immersion liquid to the fluid handling structure in a region at the high radius part.

According to an aspect, there is provided a device manufacturing method, comprising: projecting a patterned beam of radiation through an immersion liquid confined to a space between a projection system and a substrate by a meniscus pinning feature; and optionally one or more selected from the following: (a) providing gas through at least one gas supply opening radially outward of the meniscus pinning feature, (b) recovering gas which passes through the at least one gas supply opening through at least one gas recovery opening radially outward of the at least one gas supply opening, and/or (c) providing immersion fluid to the space through at least one immersion fluid supply opening radially inward of the meniscus pinning feature; wherein the meniscus pinning feature has, in plan, a cornered shape with a low radius part with a first radius of curvature at a corner and a high radius part distant from the corner with a second radius of curvature which is higher than the first radius of curvature, wherein fluid is supplied and/or recovered from at least one selected from the following: (a) the at least one gas supply opening, (b) the meniscus pinning feature, (c) the at least one gas recovery opening, and/or (d) the at least one immersion fluid supply opening, at a different rate at a peripheral position corresponding to the high radius part than to a peripheral position corresponding to the low radius part.

According to an aspect, there is provided a device manufacturing method comprising: projecting a patterned beam of radiation through an immersion liquid confined to a space between a projection system and a substrate, recovering fluid through a plurality of fluid recovery openings at least partly surrounding the space to resist the passage of a meniscus of liquid in a radially outward direction from the space in combination with a meniscus pinning feature extending between at least two of the plurality of fluid recovery openings.

According to an aspect, there is provided a fluid handling structure for a lithographic apparatus, the fluid handling structure having, at a boundary of a space configured to contain immersion fluid to a region external to the fluid handling structure, the boundary comprising at least one corner in a plane parallel to an undersurface of the fluid handling structure:
a meniscus pinning feature to resist passage of immersion fluid in a radially outward direction from the space; a meniscus stabilisation device configured to improve the stability of the meniscus pinning at the corner.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
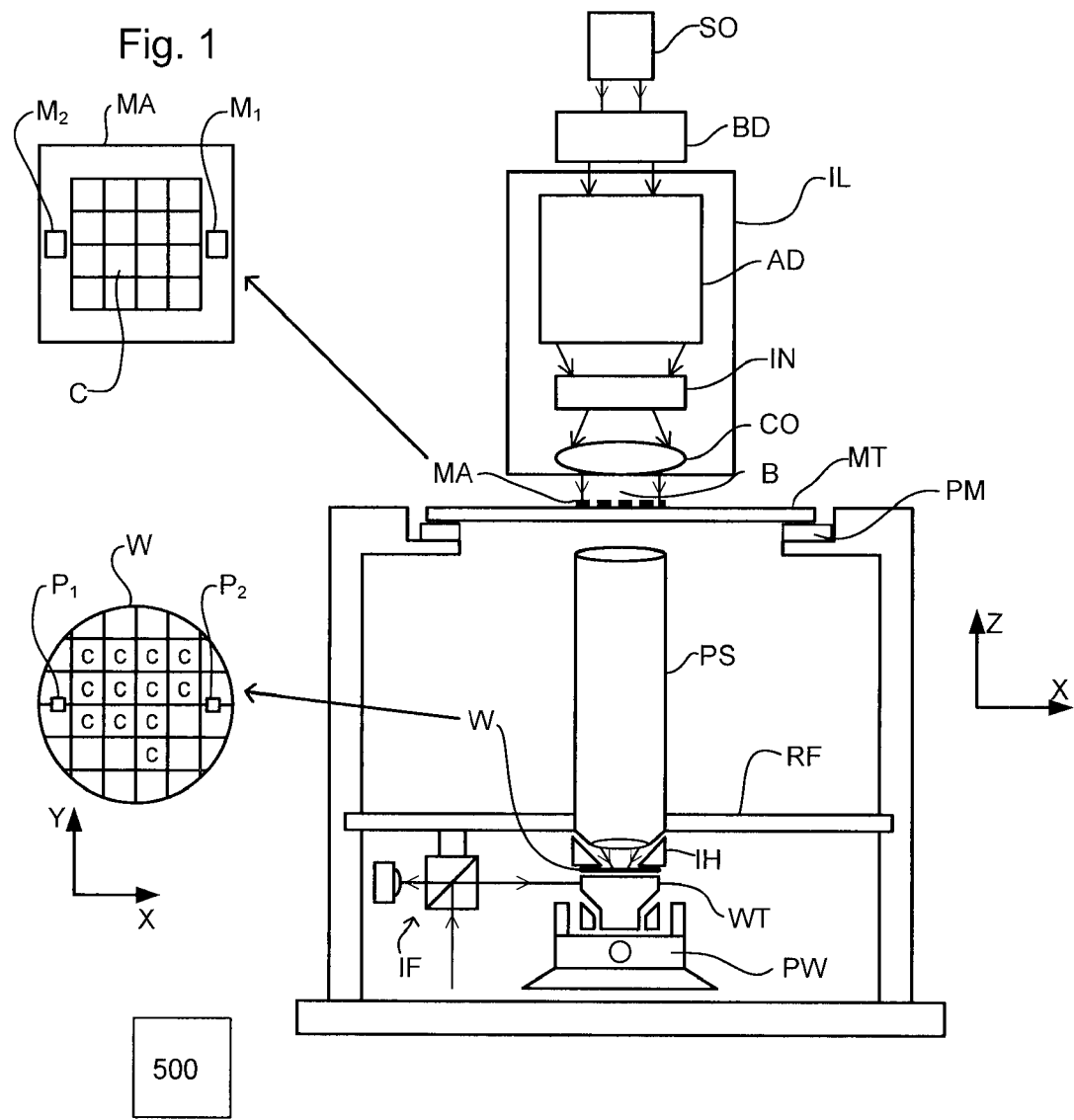
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or DUV radiation);
a support structure (e.g. a mask table) MT constructed to support a patterning device (e.g. a mask) MA and connected to a first positioner PM configured to accurately position the patterning device MA in accordance with certain parameters;
a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
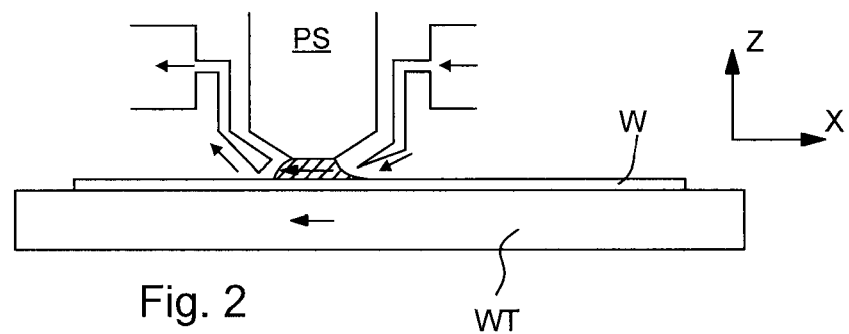
FIGS. 2 and 3 depict a liquid supply system for use in a lithographic projection apparatus.
Figure 3:
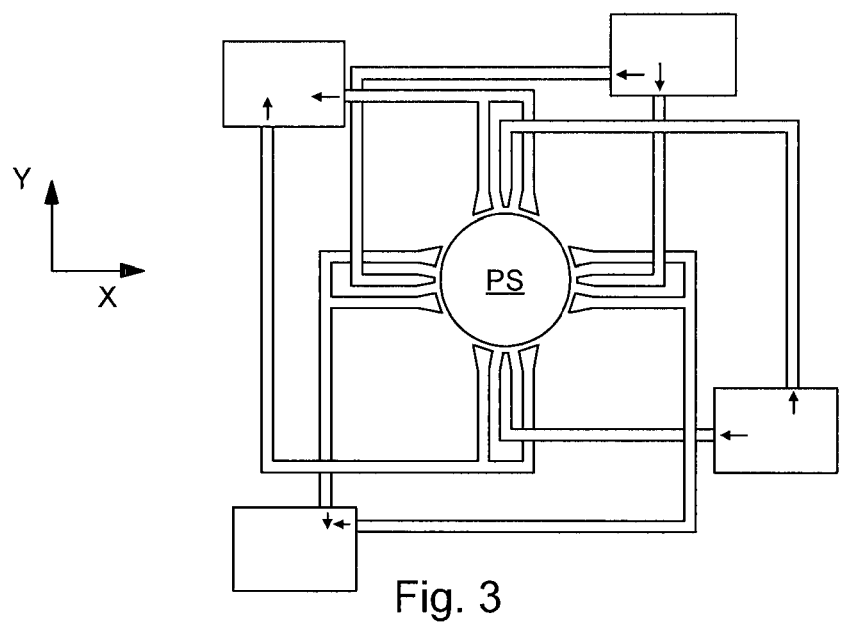

As illustrated in FIGS. 2 and 3, liquid is supplied by at least one inlet onto the substrate, desirably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
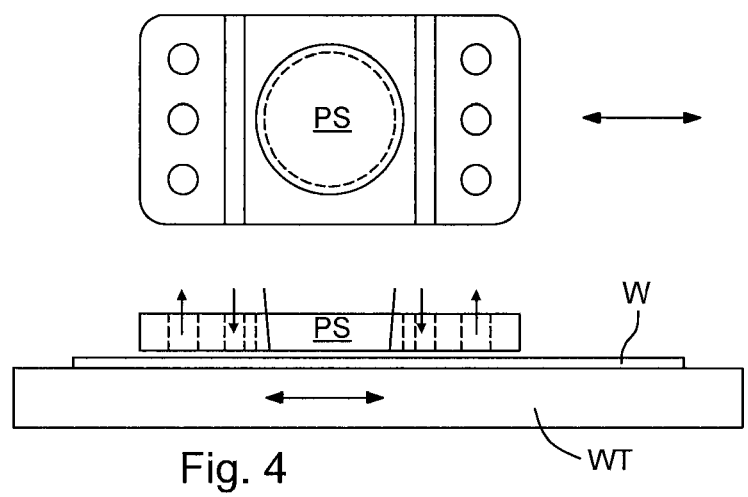
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
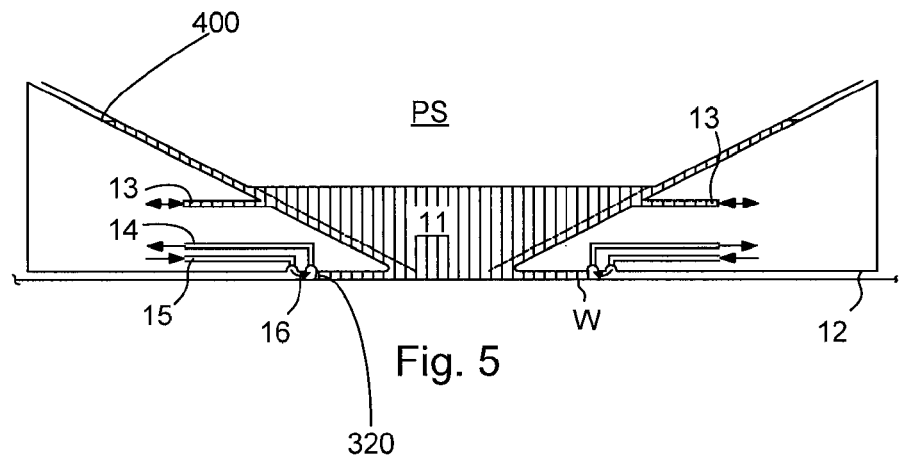
FIG. 5 depicts a further liquid supply system for use in a lithographic projection apparatus.

FIG. 5 schematically depicts a localized liquid supply system or fluid handling structure 12. The fluid handing structure serves as a barrier, confining liquid to a localized surface of the underneath surface, such as of a substrate W, a substrate table WT or both. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W. The seal may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Figure 6:
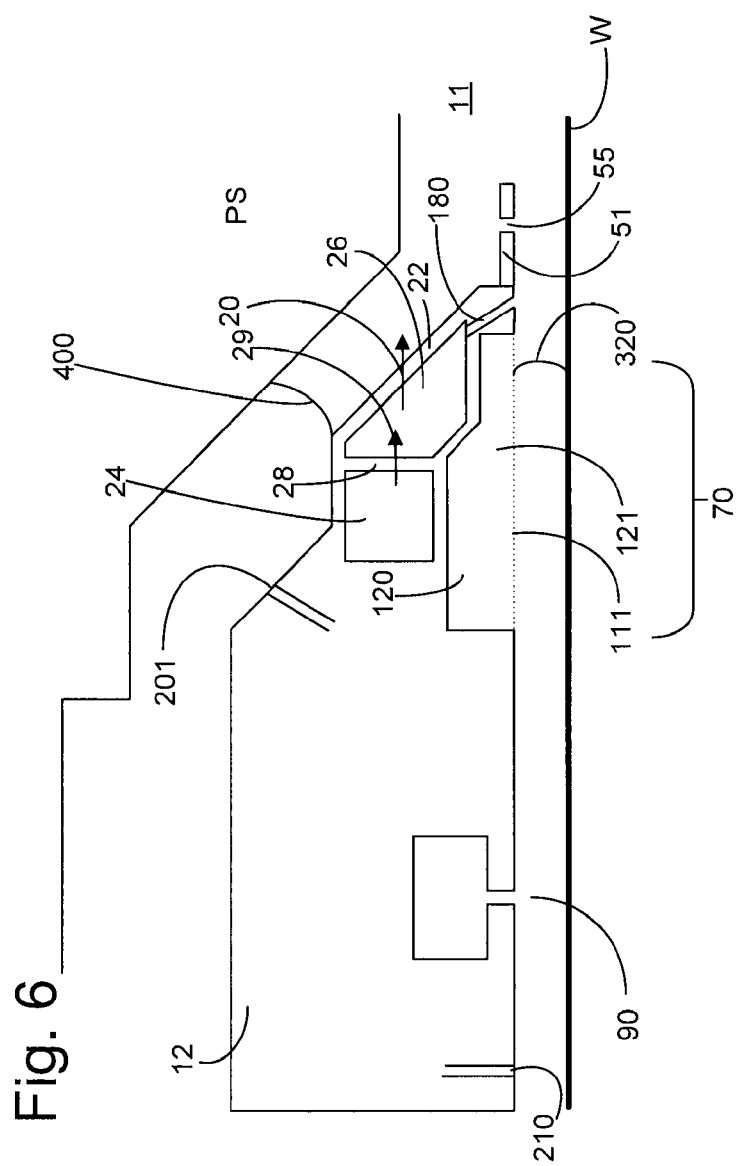
FIG. 6 depicts, in cross-section, a further liquid supply system for use in a lithographic projection apparatus.

FIG. 6 illustrates a fluid handling structure 12 which is part of a liquid supply system. The fluid handling structure 12 extends around the periphery (e.g. circumference) of the final element of the projection system PS.

A plurality of openings 20 in the surface which in part defines the space 11 provides the liquid to the space 11. The liquid passes through openings 29, 20 in side walls 28, 22 respectively through respective chambers 24, 26 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12 facing (e.g., opposite) the facing surface, e.g., the substrate W, may be an immersion fluid supply opening 180. The immersion fluid supply opening 180 can provide immersion fluid (e.g. liquid, for example an aqueous solution or water) in a direction towards the facing surface. During imaging this may be useful in preventing bubble formation in the immersion liquid by filling a gap between the substrate W and substrate table WT with liquid.

Radially outwardly of the immersion fluid supply opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet which is covered in a porous material 111 which is used to separate liquid from gas to enable single-liquid phase liquid extraction. An under pressure in chamber 121 is chosen is such that the meniscuses formed in the holes of the porous material 111 substantially prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than or equal to 90°, desirably less than or equal to 85° or desirably less than or equal to 80°, to the immersion liquid, e.g. water.

In an embodiment, the liquid supply system has an arrangement to deal with variations in the level of the liquid. This is so that liquid which builds up between the projection system PS and the liquid confinement structure 12 (forming, e.g., a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. An additional or alternative way of dealing with this liquid is to provide an outlet 201 to remove liquid reaching a certain point (e.g., height) relative to the liquid confinement structure 12 and/or projection system PS.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The cornered shape has at least one low radius part (i.e. at a corner) which has a first radius of curvature which is low relative to a second radius of curvature at a high radius part (i.e. a part between corners and/or distant from corners). The low radius part has a first radius of curvature which is lower than a second radius of curvature present at the high radius part. The second radius of curvature may be infinity i.e. the high radius part may be straight. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Figure 7:
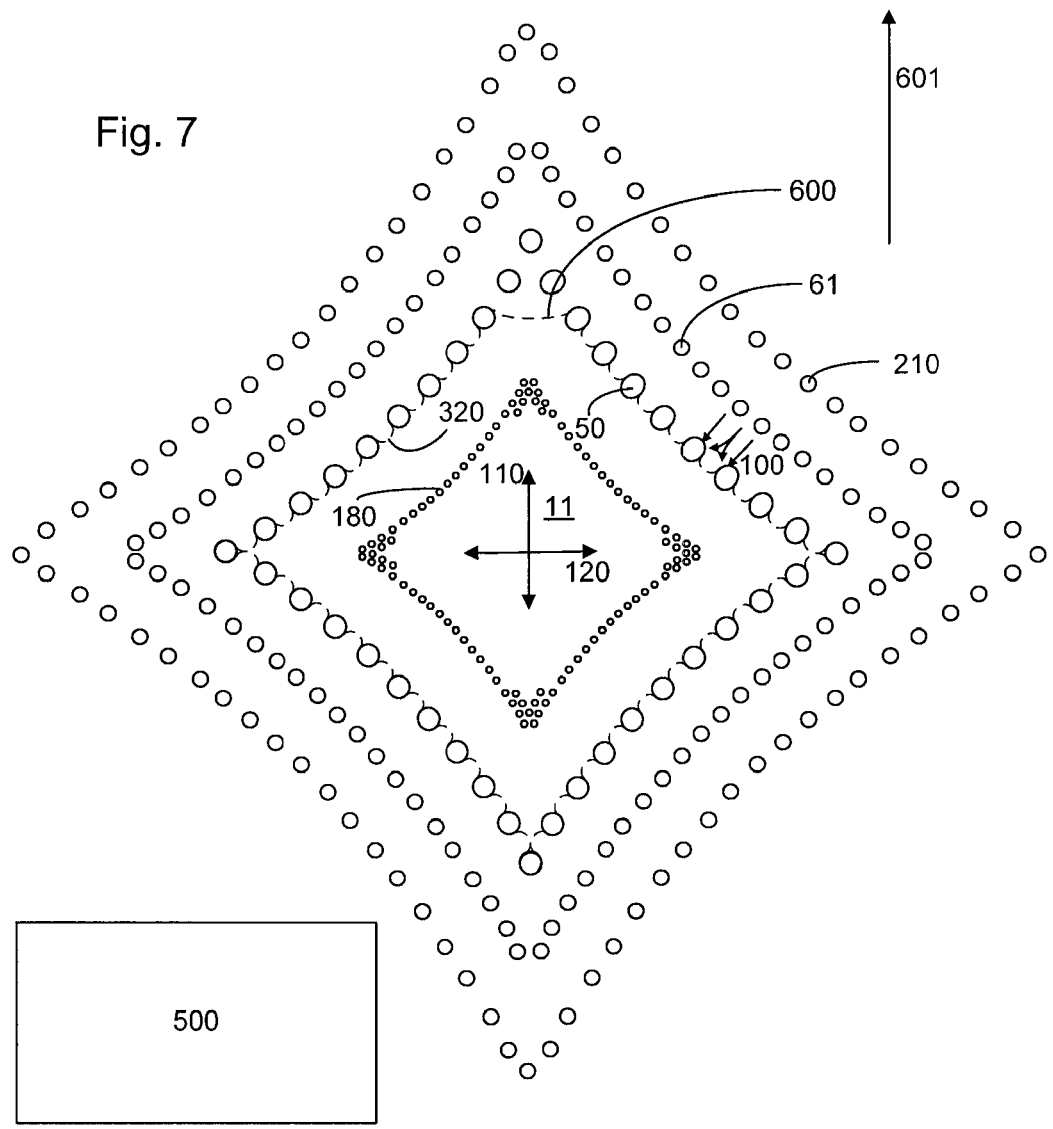
FIG. 7 depicts, in plan, a liquid supply system for use in a lithographic projection apparatus.

FIG. 7 illustrates schematically and in plan meniscus pinning features of a fluid handling system or of a fluid handling structure 12 having an extractor embodying the gas drag principle and to which an embodiment of the present invention may relate. The meniscus pinning feature is designed to resist, desirably prevent (as much as possible), the passage of fluid radially outwardly from the space 11. The features of a meniscus pinning device are illustrated in FIG. 7 which may, for example, replace the meniscus pinning arrangement 14, 15, 16 of FIG. 5 or at least the extractor assembly 70 shown in FIG. 6. The meniscus pinning device of FIG. 7 is a form of extractor. The meniscus pinning device comprises a plurality of discrete openings 50. Each opening 50 is illustrated as being circular, though this is not necessarily the case. Indeed one or more of the openings 50 may be one or more selected from: circular, elliptical, rectilinear (e.g. square, or rectangular), triangular, etc. and one or more openings may be elongate. Each opening has, in plan, a length dimension (i.e. in the direction from one opening to the adjacent opening) of greater than or equal to 0.2 mm, greater than or equal to 0.5 mm, or greater than or equal to 1 mm. In an embodiment, the length dimension is selected from the range of 0.1 mm to 10 mm or selected from the range of 0.25 mm to 2 mm. In an embodiment, the width of each opening is selected from the range of 0.1 mm to 2 mm. In an embodiment the width of each opening is selected from the range of 0.2 mm to 1 mm. In an embodiment the length dimension is selected from the range of 0.2 mm to 0.5 mm or selected from the range of 0.2 mm to 0.3 mm. Inlet openings like those of FIG. 6 (labeled 180) may be provided radially inwardly of the openings 50.

Each of the openings 50 of the meniscus pinning device of FIG. 7 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling system (or confinement structure) may be increased in pressure to generate the desired pressure difference.

In the embodiment of FIG. 7 the openings 50 are fluid extraction openings. Each opening is an inlet for the passage of gas, liquid or a two phase fluid of gas and liquid, into the fluid handling system. Each inlet may be considered to be an outlet from the space 11.

The openings 50 are formed in a surface of a fluid handling structure 12. The surface faces the substrate W and/or substrate table WT, in use. In an embodiment the openings 50 are in a substantially flat surface of the fluid handling structure 12. In an embodiment, a ridge may be present on the bottom surface of the substrate member. At least one of the openings may be in the ridge or, as described below with reference to FIG. 23, at an edge of the ridge. The openings 50 may be defined by needles or tubes. The bodies of some of the needles, e.g., adjacent needles, may be joined together. The needles may be joined together to form a single body. The single body may form the cornered shape.

The openings 50 are the end of a tube or elongate passageway, for example. Desirably the openings are positioned such that in use they are directed to, desirably facing, the facing surface, e.g. the substrate W. The rims (i.e. outlets out of a surface) of the openings 50 may be substantially parallel to a top surface of a part of the facing surface. An elongate axis of the passageway to which the opening 50 is connected may be substantially perpendicular (within +/−45°, desirably within 35°, 25° or even 15° from perpendicular) to the top of the facing surface, e.g., the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to hold, e.g. pin, the meniscus 320 between the openings 50 substantially in place as illustrated in FIG. 7. The gas flow helps maintain the liquid confined by momentum blocking, by a gas flow induced pressure gradient and/or by drag (shear) of the gas (e.g., air) flow on the liquid.

The openings 50 surround the space to which the fluid handling structure supplies liquid. The openings 50 may be distributed in an undersurface of the fluid handling structure. The openings 50 may be substantially continuously spaced around the space (although the spacing between adjacent openings 50 may vary). In an embodiment, liquid is extracted all the way around the cornered shape and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

As can be seen from FIG. 7, the openings 50 are positioned so as to form, in plan, a cornered shape (i.e. a shape with corners 52). In the case of FIG. 7 this is in the shape of a rhombus, desirably a square, with curved edges or sides 54. The edges 54, if curved, have a negative radius. The edges 54 may curve towards the center of the cornered shape in areas away from the corners 52. An embodiment of the invention may be applied to any shape, in plan, including, but not limited to the shape illustrated, for example, a rectilinear shape, e.g. a rhombus, a square or rectangle, or a circular shape, a triangular shape, a star shape, an elliptical shape, etc.

The cornered shape has principal axes 110, 120 aligned with the major directions of travel of the substrate W under the projection system PS. This helps ensure that, below a critical scan speed, the maximum scan speed is faster than if the openings 50 were arranged in a circular shape. This is because the force on the meniscus between two openings 50 is reduced with a factor cos θ Here θ is the angle of the line connecting the two openings 50 relative to the direction in which the substrate W is moving.

The use of a square cornered shape allows movement in the step and scanning directions to be at an equal maximum speed. This may be achieved by having each of the corners 52 of the shape aligned with the scanning and stepping directions 110, 120. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of about 90° to 105°, in an embodiment selected from the range of about 85° to 105°).

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which 0 is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

There may be no meniscus pinning feature radially inwardly of the openings 50. The meniscus is pinned between the openings 50 with drag forces induced by gas flow into the openings 50. A gas drag velocity of greater than or equal to about 15 m/s, desirably about 20 m/s should be sufficient. The amount of evaporation of liquid from the substrate may be reduced thereby reducing both splashing of liquid as well as thermal expansion/contraction effects.

Radially inwardly of the openings 50 which act as a meniscus pinning feature are a plurality of immersion fluid supply openings 180, as in the embodiment of FIG. 6. The immersion fluid supply openings 180 may have, in plan, the same shape as the openings 50, in plan. In an embodiment the immersion fluid supply openings 180 are smaller, in plan, than the openings 50. The immersion fluid supply openings 180 may have a diameter (in the case of a circular shape) or a side length (in the case of a square shape) of the order of 125 μm, for example. As illustrated, there may be more immersion fluid supply openings 180 at corner regions than at non corner regions.

Other geometries of the bottom of the fluid handling structure 12 are possible. For example, any of the structures disclosed in U.S. patent application publication no. US 2004-0207824 or U.S. patent application publication no. US 2010-0313974, which are both incorporated herein in their entirety by reference, could be used in an embodiment of the present invention.

In a fluid handling structure 12 such as that described in US 2010/0313974, a gas knife in the form of a slit opening (e.g. a continuous linear opening) is provided around the openings 50. The width of the slit may be about 30 or 50 μm. A gas knife in the form of a slit opening may also be provided around the extractor 70 of the FIG. 6 embodiment. A gas knife in the form of a slit opening might have a width of 50 μm.

Figure 10:
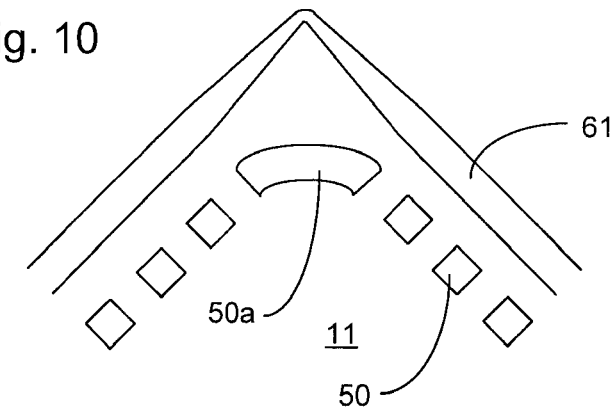
FIG. 10 depicts, in plan, a corner of a liquid supply system for use in a lithographic projection apparatus.

In an embodiment a gas knife in the form of a slit opening may be provided around the meniscus pinning feature (e.g. the extractor 70 of the FIG. 6 embodiment or the openings 50 of the FIG. 7 embodiment). Such an embodiment is illustrated in FIG. 10. An embodiment of the invention is not limited to a slit form of opening surrounding the meniscus pinning feature and, as described below the slit opening may instead be a plurality of discrete apertures. Use of discrete gas supply openings 61 compared to a slit may be advantageous as described in U.S. patent application no. U.S. 61/506,442, filed on 11 Jul. 2011, which is hereby incorporated by reference in its entirety.

In an embodiment shown in FIGS. 6 and 7, a plurality of gas supply openings 61 (i.e. discrete apertures) are provided in a linear array. Relative to the space, the gas supply openings 61 are provided radially outward of the meniscus pinning feature (the extractor 70 and openings 50, respectively). The linear array made by the gas supply openings 61 may be substantially parallel to the lines joining the openings 50. In use, the gas supply openings 61 are connected to an over pressure and form a gas knife (supplying a gas, e.g. air) surrounding the meniscus pinning device. The plurality of gas supply openings 61 in a linear array (e.g. a one or two dimensional linear array) at least partly surround the meniscus pinning feature.

An example of a linear array is a line along which features are located. An example of a linear array comprises two or more rows of openings. Such a linear array may be referred to as a two dimensional linear array, in which the features are arranged along a line or the array as well as in a direction perpendicular to the line. The openings may be periodically arranged along the linear array. For example the openings along the rows may be staggered. In one or more of the rows of openings, each of the openings may be aligned in a line. The openings in two of the rows may be staggered with respect to each other (i.e. two lines of holes).

In an embodiment, the gas supply openings 61 function to reduce the thickness of a liquid film left on a facing surface, such as the substrate W or substrate table WT, in passage under the fluid handling structure 12. For example the gas supply openings may function to reduce the thickness of a droplet moving relatively towards meniscus 320 from radially outward of the linear array, or a droplet relatively moving from the meniscus 320 radially outwardly. With the substantially same flow rate through the plurality of gas supply openings 61 (for example with a diameter of 90 μm and 200 μm pitch) a higher average pressure peak under the openings may be achieved than for a slit gas knife with a slit width of, for example, 50 μm, using the same flow rate. The discrete gas supply openings 61 therefore may cause a thinner liquid film to be left on the facing surface after passage of the liquid film under the fluid handling structure 12. The higher average pressure peak may result in improved efficiency in stopping droplets moving relative to the meniscus 320. The higher average pressure peak may result in even better performance when the gap between the edge of a substrate W and the substrate table WT is crossed. When using a slit gas knife, the pressure peak under the slit may collapse because the gas flow out of the slit can be sucked away through the openings 50. The pressure peak of the plurality of gas supply openings 61 may be less likely to be sucked away through openings 50. This may result in better performance as the pressure peak is more stable.

The gas supply openings 61 may help to ensure that the liquid film does not break into droplets but rather the liquid is driven towards the openings 50 and extracted. In an embodiment the gas supply openings 61 operate to prevent the formation of a film. The linear array in which the gas supply openings 61 are arranged generally follows the line of the meniscus pinning feature (e.g. openings 50). Thus the distance between adjacent meniscus pinning features (e.g. openings 50) and the gas supply openings 61 is within 0.5 mm to 4.0 mm, desirably 2 mm to 3 mm. The distance between the gas supply openings 61 and openings 50 can be small while still reducing the risk of bubbles derived from droplet collision with the meniscus 320, compared to a slit gas knife.

In an embodiment the linear array in which the gas supply openings 61 are arranged is elongate in a direction substantially parallel to the line of the meniscus pinning feature (e.g. openings 50). In an embodiment a substantially constant separation between adjacent ones of the meniscus pinning feature (e.g. openings 50) and the gas supply openings 61 is maintained.

In an embodiment the plurality of gas supply openings 61 in a linear array acts as a gas knife.

The fluid handling structure may be as described in U.S. patent application no. U.S. 61/506,442, filed on 11 Jul. 2011, except as described below. None or any combination of the immersion fluid supply openings 180, gas supply openings 61 (or gas knife) and extraction openings 210 may be present. That is: the extraction openings 210 are optional; the gas supply openings 61 are optional; and the immersion fluid supply openings 180 are optional. The immersion fluid supply openings 180, gas supply openings 61 and extraction openings 210 may be present in any combination (though their position relative to one another and in particular relative to the meniscus pinning feature (i.e. openings 50) is fixed).

In order for the discrete gas supply openings 61 to exhibit gas knife like functionality, an open area of less than or equal to $6.0 \times 10^{-5}$ m$^2$ per meter length is desirable. This equates to the same open area per unit length as a gas knife with a slit width of 60 μm. In an embodiment the open area per meter length is less than or equal to $5.0 \times 10^{-5}$ m$^2$, less than or equal to $4.0 \times 10^{-5}$ m$^2$ or less than or equal to $3.5 \times 10^{-5}$ m$^2$. The lower the open area ratio, the higher the maximum achievable pressure under each opening and the more like a raking action may be achieved. However, if the open area becomes too small the gas knife functionality is lost because of the impracticality of reducing the pitch between adjacent gas supply openings to less than or equal to 180 μm. In an embodiment the open area per meter length is greater than or equal to $1.0 \times 10^{-5}$ m$^2$, greater than or equal to $2.0 \times 10^{-5}$ m$^2$, or greater than or equal to $2.5 \times 10^{-5}$ m$^2$. Larger open areas are desirable as this allows larger gas flows and therefore higher achievable pressure.

In an embodiment the gas supply openings 61 are circular (round) in cross-section. In an embodiment the diameter or maximum dimension in the case of a non-circular opening 61 is less than or equal to 125 μm, desirably less than or equal to 115 μm. This equates to an area per opening of at most (calculated for the case of a square opening) $1.6 \times 10^{-8}$ m$^2$, desirably at most $1.3 \times 10^{-8}$ m$^2$.

Theoretical calculations indicate that the diameter or maximum dimension in the case of a non-circular opening 61 should be at least ½ the working distance. The working distance is the distance between the bottom surface of the fluid handling structure 12 and the facing surface (e.g. substrate W). A distance between the under surface of the fluid handling structure 12 and the facing surface (working distance or fly height) may be 150 μm, indicating a minimum diameter or minimum dimension in the case of a non-circular opening 61 of 75 μm in an embodiment. If this requirement is met, the core of the gas jet exiting the gas supply opening 61, which is not disturbed by the stagnant environment which the jet penetrates, reaches the facing surface and so a large pressure gradient is generated.

In an embodiment the discrete gas supply openings 61 have a diameter or minimum dimension in the case of a non-circular opening 61 of greater than or equal to 80 μm, more desirably greater than or equal to 90 μm. A cross-sectional area of greater than or equal to $5.0 \times 10^{-9}$ m$^2$ per meter length or greater than or equal to $6.4 \times 10^{-9}$ m$^2$ per meter length is therefore desirable. This range of hole sizes makes a balance between the ability to manufacture (at the lower size range), and the maximum allowable pitch between adjacent gas supply openings 61 (at the upper size range). That is, the maximum allowable pitch is related to the pitch which can lead to the minimum pressure being above a predefined minimum (e.g. 50 mbar) between adjacent openings 61. Additionally, if too little material is left between adjacent openings, this can result in weakness and potential breakage of the material between adjacent openings. This leads to a maximum hole diameter or maximum dimension in the case of a non-circular hole.

In an embodiment, the pitch between adjacent gas supply openings 61 is greater than or equal to 180 μm, desirably greater than or equal to 200 μm. Conversely, the pitch should be less than or equal to 300 μm, desirably less than or equal to 280 μm. These ranges strike a balance between strength and joining together of gas streams from adjacent openings and thereby provide a large minimum pressure between openings (of at least 30 mbar, desirably at least 50 mbar).

In an embodiment, in order for the minimum desired pressure between adjacent holes of the plurality of gas supply openings 61 in a line to be achieved, the length of material between adjacent holes should be a maximum of half the distance between the bottom surface of the fluid handling structure 12 and the facing surface. This gives a minimum length of material of 75 μm. In an embodiment, the pitch is chosen such that gas jets out of each discrete gas supply opening 61 overlap with an adjacent discrete gas supply opening. The gas jet tends to spread out with a one to four gradient at the edge. Therefore in an embodiment, for the jets to overlap, the gas supply openings 61 should be less than or equal to 2 times ¼ of the working distance apart or ½ the working distance apart or less.

In an embodiment, material present between adjacent openings 61 should be at least 80 μm long, or at least 90 μm long to provide sufficient strength.

More than or equal to 200 μm of material between adjacent openings 61 may be unnecessary and may lead to separation of gas jets and thereby a pressure of less than or equal to 30 mbar between openings. In an embodiment at most a distance of 150 μm between adjacent gas supply openings 61 may be provided.

In an embodiment, the gas supply openings 61 have a diameter of 125 μm and a pitch of 300 μm at peripheral (e.g., circumferential) positions corresponding to high radius parts which results in an open area of $5.8 \times 10^{-5}$ m$^2$ per meter. If the pitch is reduced to 180 μm, the open area rises to $9.8 \times 10^{-5}$, but in some circumstances that may be too much and only leaves a length of 55 μm of material between openings 61. In an embodiment the opening 61 diameter is 80 μm, this leads to an open area of $2.79 \times 10^{-5}$ m$^2$ per meter with a pitch of 180 μm which is close to equivalent to a slit width of 30 μm.

In an embodiment a large pressure gradient exists in a direction going between adjacent gas supply openings 61 and this may result in droplets moving to the point of lowest pressure between openings 61. Here droplets can conglomerate. Some droplets may pass at the point of lowest pressure between gas supply openings 61. Therefore, as illustrated in cross section in FIG. 6 and in plan in FIG. 7, in an embodiment at least one extraction opening 210 is provided radially outwardly of the plurality of discrete gas supply openings 61 in a linear array.

In an embodiment the at least one extraction opening 210 may be a plurality of extraction openings 210. In an embodiment at least one extraction opening 210 is a slit opening (i.e. continuous). This embodiment is advantageous in that droplets, irrespective of where they pass the plurality of gas supply openings 61, are collected. In an embodiment each space between adjacent gas supply openings 61 has a corresponding extraction opening 210. In an embodiment the extraction openings 210 are a plurality of gas extraction openings in a linear array (e.g. a line).

In an embodiment where the at least one extraction opening 210 is a plurality of extraction openings 210, the gas knife may be in the form of a slit or continuous opening. That is, the plurality of gas supply openings 61 described in FIG. 7 comprise a slit (i.e. continuous) opening.

A droplet which passes the linear array of gas supply openings 61 will pass at a position of lowest pressure. As a result, the droplet will pass substantially equidistant between adjacent openings 61. Therefore the extraction opening 210 is positioned substantially equidistant between adjacent openings 61 as described above. That is, at a position which bisects the space between adjacent openings 61. As a result a droplet which passes the linear array of gas supply openings 61 is likely to pass under an extraction opening 210 corresponding to the space through which the droplet has moved. As a result, the droplet is likely to be extracted by the extraction opening 210. An extraction takes place if the droplet touches the extraction opening 210. Thus the effect of the tangential pressure gradient which results in conglomeration of droplets is advantageous as this leads to larger droplets which are more likely to touch the extraction openings 210.

The extraction openings 210 may have the same characteristics and/or dimensions as the gas supply openings 61 described above. The at least one extraction opening 210 may be discontinuous, continuous, a two dimensional linear array (e.g. two substantially parallel lines of openings), etc.

In an embodiment, the distance between the at least one extraction opening 210 and the plurality of gas supply openings 61 is at least 0.2 mm and at most 1.0 mm. This relatively short distance is advantageous because droplets are more likely to be captured. If the distance is too short, this can led to interference between the gas flows out of the gas supply openings 61 and into the extraction openings 210 which is undesirable.

Very small bubbles of gas may dissolve in the immersion liquid before they reach the exposure area of the space 11. In an embodiment, which can be combined with any other embodiment, the fact that dissolution speed is dependent upon the type of the trapped gas and the immersion liquid properties is used.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

U.S. patent application publication no. US 2011-0134401, hereby incorporated in its entirety by reference, describes supplying a gas with a solubility in the immersion liquid greater than or equal to $5 \times 10^{-3}$ mol/kg at 20° C. and 1 atm total pressure to a region adjacent the space 11. It also describes supplying a gas with a diffusivity in the immersion liquid greater than or equal to $3 \times 10^{-5}$ cm$^2$ s$^{-1}$ at 20° C. and 1 atm total pressure to a region adjacent the space 11. It also describes supplying a gas with a product of diffusivity and solubility in the immersion liquid of greater than that of air at 20° C. and 1 atm total pressure to a region adjacent the space 11.

If the bubble of gas is of a gas which has a high diffusivity, solubility or product of diffusivity and solubility in the immersion liquid, it will dissolve into the immersion liquid much faster. Therefore, using an embodiment of the invention should reduce the number of imaging defects thereby allowing higher throughput (e.g., higher speed of the substrate W relative to the liquid handling structure 12) and lower defectivity.

Therefore, an embodiment of the present invention provides a gas supplying device configured to supply gas to a region (e.g. to a volume, or a towards an area) adjacent the space 11. For example, gas is provided such that it is present in the region adjacent to the meniscus 320 extending between the facing surface and the liquid handling structure 12.

An example gas is carbon dioxide which may be desirable because it is readily available and may be used in immersion systems for other purposes. Carbon dioxide has solubility in water at 20° C. and 1 atm total pressure of $1.69 \times 10^{-3}$ kg/kg or $37 \times 10^{-3}$ mol/kg. Any non-reactive gas which readily dissolves in immersion liquid is suitable.

An embodiment of the present invention herein described may form a $CO_2$ atmosphere around the meniscus 320 of immersion liquid so that any inclusion of gas into the immersion liquid creates a gas inclusion which dissolves in the immersion liquid.

By using gaseous $CO_2$ the problem associated with the meniscus colliding with a droplet of liquid may be reduced if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet could be less significant. The immersion system could be more tolerant of interacting with immersion liquid which had escaped from the space.

Carbon dioxide can be provided through gas supply openings 61. In an embodiment, the gas is supplied through a second array of gas supply openings or through both the gas supply openings and the second array of gas openings.

In an embodiment the flow rate of carbon dioxide out of openings 50 summed with the flow rate of gas out of extraction openings 210 is greater than or equal to the flow rate of gas out of gas supply openings 61. In an embodiment, the summed gas extraction rate is more than or equal to 1.2 or desirably more than or equal to 1.4 times the gas supply rate. For example, the gas flow rate into the openings 50 may be 60 liters per minute, the gas flow rate into extraction openings 210 may be 60 liters per minute and the gas flow rate out of gas supply openings 61 may be 90 liters per minute. This arrangement is advantageous if the gas supplied out of the gas supply openings 61 is carbon dioxide (described below). This is because carbon dioxide may interfere with an interferometer outside the fluid handling structure 12. By arranging the flow rates as described, loss of carbon dioxide out of the fluid handling structure 12 can be reduced or prevented. The containment of the carbon dioxide may be desirely improved.

In the case of using $CO_2$ in the gas knife, flow variations resulting from inhomogeneity in the gas flow can result in gas which is not $CO_2$ (e.g. air) from the atmosphere outside of the fluid handling structure 12 being mixed into the flow which can then reach the openings 50. This can be undesirable.

For the case that carbon dioxide is supplied out of the gas supply openings 61, the distance between the extraction openings 210 and the gas supply openings 61 may be at least 1 or 2 mm or within 1.0 mm to 4.0 mm, desirably within 2 mm to 3 mm. A design rule could be 4 times the working distance plus 0.2-0.5 mm. This effectively helps prevent mixing of gas from outside of the fluid handling structure 12

(e.g., air radially outwardly of the extraction openings 210) into the carbon dioxide adjacent the meniscus 320.

In an embodiment, the effectiveness of extraction openings 210 in removing liquid from a facing surface, for example in the form of droplets, decreases with increased distance from a threshold distance from the gas supply openings 61. The threshold distance for droplet removal, for desired operating conditions, may be less than the desired distance between the extraction openings 210 and the gas supply openings 61. When using carbon dioxide as the gas exiting the gas supply openings 61, it may be advantageous to use grooves 220 (of which only a few are shown in FIG. 7 merely for clarity reasons) in the undersurface of the fluid confinement structure 12 because the grooves 220 help in extending the threshold distance between the gas supply openings 61 and extraction openings 210 for droplet removal. The grooves 220 therefore assist in achieving effective carbon dioxide gas removal and droplet removal through the outer extractors.

The above embodiments have been described with reference to the presence of only one linear array of gas supply openings 61 surrounding the meniscus pinning features. However, an embodiment of the present invention is equally applicable to the case where a second (or more) plurality of gas supply openings 61 in a linear array is positioned at least partly to surround the first plurality of gas supply openings 61. The arrangement may be similar to that described in U.S. patent application publication no US 2011-0090472 except that one or both of the two slit gas knives are replaced with a plurality of discrete gas supply openings as described hereinabove. This may be advantageous where particularly fast relative movement between the fluid handling system 12 and the facing surface occurs. Such a larger relative velocity may be used in a lithographic apparatus for exposing substrates having a larger diameter than the current industry standard of 300 mm, for example substrates of 450 mm in diameter.

It is desirable to increase the stability of the meniscus 320 which is pinned by the meniscus pinning feature (for example openings 50 or extractor 70). An unstable meniscus can lead to loss of liquid and generation of a droplet which can lead to bubble inclusion, as described below, or can lead to inclusion of a gas bubble at the meniscus 320, as described below.

During movement of the fluid handling structure, for example in a scanning direction 601, the meniscus 600 at the leading edge, particularly at a corner of a leading edge (a low radius part), the meniscus 600 may detach from the openings 50, as illustrated in FIG. 7. This detachment may be as a result of the geometry of the fluid handling structure and may occur whether or not $CO_2$ or other highly soluble gas is provided out of the gas supply openings 61, or irrespective even of the presence of the gas supply openings 61, extraction openings 210 and immersion fluid supply openings 180. The meniscus 600 may detach from several of the openings 50. The openings 50 may be circular as illustrated in FIG. 7 or may generally be square as illustrated, for example, in FIG. 8, with a slot opening 50a positioned at the tip of the corner. The meniscus 600 may detach from the corner slot 50a as well as one or more neighboring openings 50.

The detachment and generation of a long unsupported meniscus 600 can be problematic in that it can lead to loss of liquid from the space 11. This can result in the generation of a droplet. When the meniscus 320 and a droplet, for example a droplet of liquid which has escaped the space 11, collide, a bubble of gas may be included into the space 11. Inclusion of a bubble into the space 11 is detrimental because a bubble of gas can lead to an imaging error. Alternatively or additionally a bubble of gas can be included at the meniscus 600, because of the meniscus length, when the meniscus returns to the openings 50, 50a. Therefore, it is desirable to reduce the chance of the meniscus 320 from detaching from adjacent openings 50.

In U.S. patent application no. U.S. 61/506,442 filed on 11 Jul. 2011, the plurality of gas supply openings 61 (and extraction openings 210) are described as being similar in size (within 5% of each other) and having a substantially constant pitch between adjacent openings. In an embodiment of the present invention the stability of the meniscus 320 at the meniscus pinning feature is stabilized (particularly at a corner) by introducing a meniscus stabilization device. In an embodiment the meniscus stabilization device is a variation (e.g. an asymmetry, for example in the form of a change in pitch, change in opening size, change in distance between features, change in number of features, etc.) around the periphery (e.g., circumference) of the space 11. This variation can be applied to at least one of the gas supply openings 61, extraction openings 210 and immersion fluid supply openings 180. The variation occurs particularly around areas where meniscus 320 stability may otherwise be compromised. One such example is at a corner (e.g., a low radius part). However, other peripheral positions may require additional measures to be taken to increase meniscus 320 stability, for example those areas of the periphery which cross over a gap in the facing surface, for example between a substrate and a substrate table (or a different object on the substrate table or another table) in a direction in which the gap and meniscus pinning feature are elongate in a co-parallel direction or near co-parallel direction.

Measures can be taken to reduce the radial inward force on the meniscus 600 at a location at which the meniscus detaches from the openings 50. Generally an increase in immersion liquid from the immersion fluid supply openings 180 towards the unstable meniscus 600 will help reduce the chance of the meniscus 600 from detaching from the openings 50. Additionally or alternatively, a reduction in gas flow velocity towards the unstable meniscus 600 may benefit this. The reduction in gas flow velocity can be achieved in several ways. Four ways are illustrated in FIGS. 8-11. These all relate to changing the geometry of the gas supply openings 61. However, if opposite measures are taken with the extraction openings 210, the same effect may be achieved, as described below.

Figure 8:
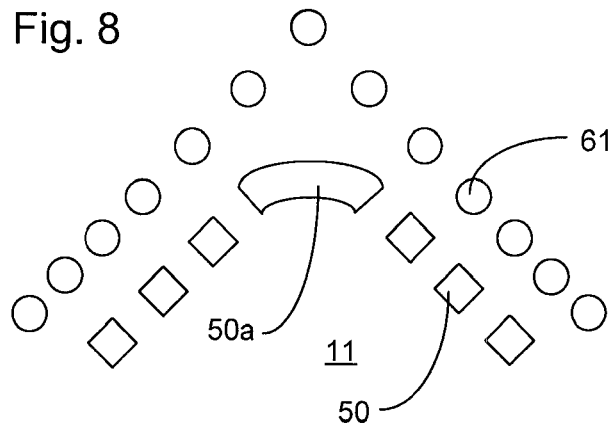
FIG. 8 depicts, in plan, a corner of a liquid supply system for use in a lithographic projection apparatus.
Figure 16:
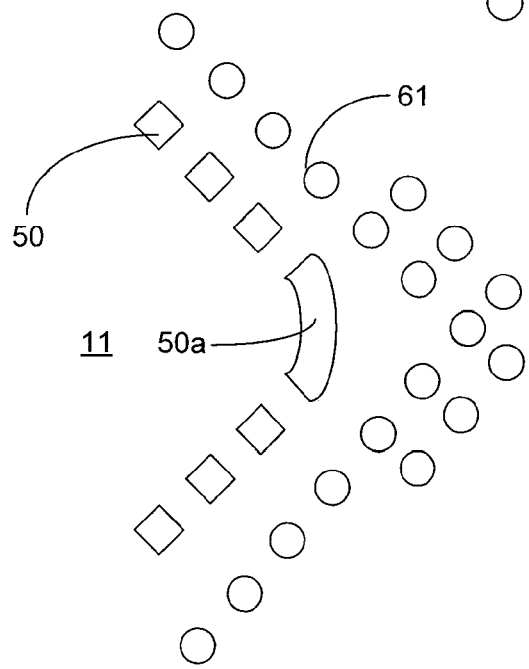
FIG. 16 depicts, in plan, a corner of a liquid supply system for use in a lithographic projection apparatus.
Figure 17:
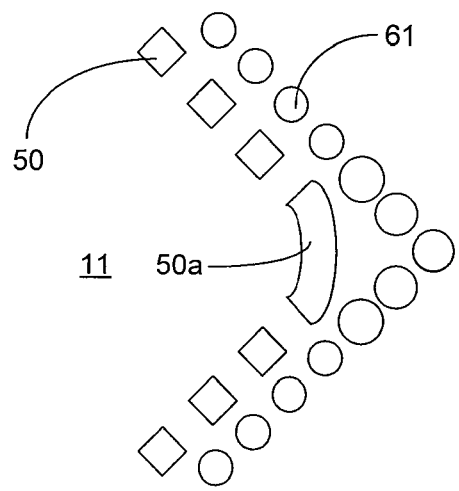
FIG. 17 depicts, in plan, a corner of a liquid supply system for use in a lithographic projection apparatus.

In FIG. 8, the opening dimension (e.g., diameter) of the gas supply openings 61 is substantially constant but the pitch (distance between adjacent openings) for the gas supply openings 61 is varied in the area adjacent the unstable meniscus 600. That is, the gas supply openings 61 have a substantially constant pitch at other areas (peripherally corresponding to the high radius part). At the corner (the low radius part) the pitch is increased. Thus, there is a variation in open area per meter length peripherally around the space 11. This is achieved by varying the number of openings per unit length. If each of the openings 61 is subjected to the same overpressure (for example by arranging for each of the openings 61 to share a common chamber or channel or manifold upstream of the openings) then the speed of gas at the corner (the low radius part) will be reduced thereby improving the meniscus 600 stability at that position. The same effect may be achieved by reducing the pitch of the extraction openings 210 at a peripheral position which corresponds to the low radius part. Thus, if each of the extraction openings 210 is subjected to the same underpressure (for example by being connected to a common chamber or channel or manifold) because of the presence of more openings at the corner, a greater flow of gas away from the unstable meniscus 600 at the low radius part can be expected, thereby reducing the chance of the meniscus 600 detaching from the openings 50. The same effect can be achieved by providing at a peripheral position corresponding to a high radius part, two rows of gas supply openings 61 and at a peripheral position corresponding to a low radius part (i.e. a corner), only one row of gas extraction openings 61. This is the opposite to what is shown in FIG. 16 described below. What is shown in FIG. 16 could be applied to the extraction openings 210 to increase the number of openings at a peripheral position corresponding to the low radius part. That is, the number or rows of openings can be increased or decreased at the low radius part instead of or additionally to decreasing and increasing the pitch (and/or area as described below with reference to FIG. 9) of openings.

Figure 9:
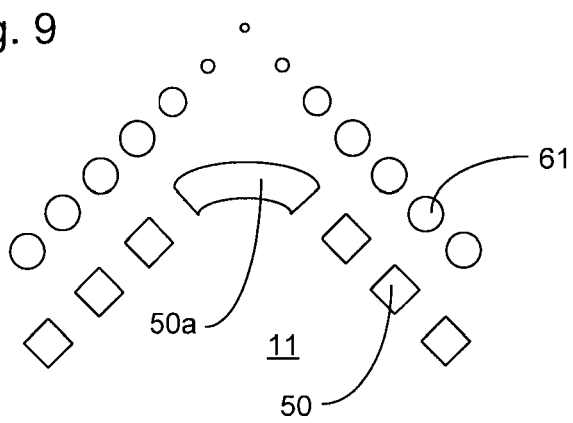
FIG. 9 depicts, in plan, a corner of a liquid supply system for use in a lithographic projection apparatus.

FIG. 9 shows an embodiment in which the pitch of the gas supply openings 61 remains substantially constant but the area of the openings decreases at a peripheral position corresponding to the low radius part. Thus, there is a variation in open area per meter length peripherally around the space 11. This is achieved by varying the width (e.g. diameter) of the openings. The same effect can be achieved by increasing the area of the extraction openings 210 at a peripheral position corresponding to the low radius part.

Combinations of changing the pitch and/or changing the area of one or both of the gas supply openings 61 and extraction openings 210 are possible. For example, one or more of the following may be implemented in order to reduce the speed of gas at the low radius part: increase in pitch of the gas supply openings 61, reduction in area of the gas supply openings 61, decrease in pitch of the gas extraction openings 210, and/or increase in size of the gas extraction openings 210.

FIG. 10 illustrates how the variation in open area per meter length peripherally around the space 11 may be implemented in the case of the at least one gas supply opening 61 (or the at least one extraction opening 210) being in the form of a slit. As can be seen, the width of the slit is reduced at a peripheral position (for the case of the gas supply opening 61) corresponding to the low radius part. For the extraction opening in the form of a slit, the width of the slit would be increased at a peripheral position corresponding to the low radius part.

The embodiments described with reference to FIGS. 8-10 all change the effective open area per unit length through which gas can be supplied/extracted peripherally around the space 11. These measures may be taken additional to the measures described with reference to FIGS. 11 and 12.

Additionally or alternatively, similar measures to those described above and below (though in the opposite sense (e.g. an increase in open area per meter length)) may be applied at a radial position corresponding to the low radius part in the immersion fluid supply openings 180. That is, the variation may occur at peripheral positions corresponding to high radius parts and not low radius parts. For instance, with reference to FIG. 8, the pitch of immersion fluid supply openings 180 may be substantially constant at a peripheral position corresponding to a low radius part but may vary (become closer together at a substantially constant rate, for example) at peripheral positions corresponding to high radius parts.

Figure 11:
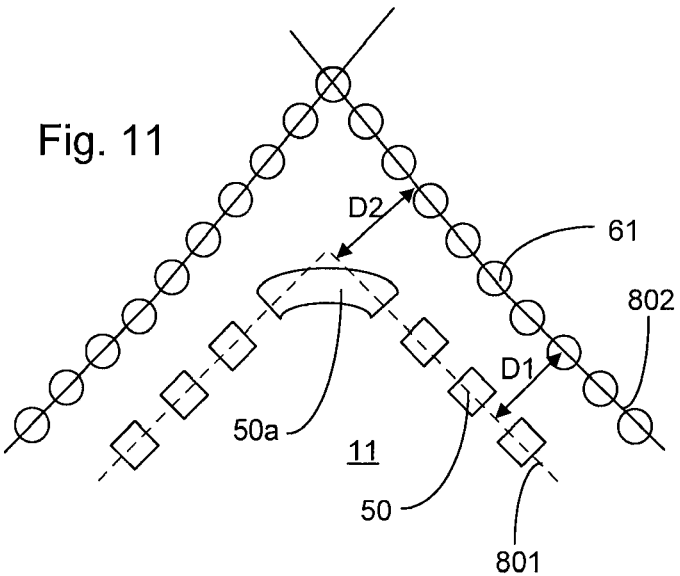
FIG. 11 depicts, in plan, a corner of a liquid supply system for use in a lithographic projection apparatus.

In FIG. 11 a minimum radial distance between a line passing along one set of openings 180, 50, 61, 210 and a line passing along another set of openings 180, 50, 61, 210 is varied peripherally around the space. The opening size and pitch and number per unit length is kept substantially constant. In the embodiment of FIG. 11 the minimum radial distance between a line 801 passing along the openings 50 of the meniscus pinning feature and a line 802 passing along the gas supply openings 61 is increased at a peripheral position corresponding to the low radius part. For the same flow rate of gas out of the gas supply openings 61, in the case where there is no variation in distance between the openings 50 and gas supply openings 61, the speed of gas towards the meniscus 600 at the low radius part will be reduced. Therefore, the minimum distance D1 between the lines 801, 802 at a peripheral position at the high radius part D1 is smaller than the minimum distance D2 between the lines 801, 802 at a peripheral position at the low radius part. Additionally or alternatively, the same effect can be achieved by arranging for a minimum distance between a line which passes along adjacent extraction openings 210 and the line 802 to be higher at a radial position corresponding to the low radius part than the corresponding minimum distance at a radial position corresponding to a high radius part.

A similar effect can be achieved by moving the immersion fluid supply openings 180 at a radial position corresponding to a low radius part closer to the openings 50 than immersion fluid supply openings 180 at a radial position corresponding to a high radius part.

Distance D1 in FIG. 11, in the case of $CO_2$ being supplied out of the gas supply openings 61 may be of the order of 1.5-3 mm. The variation in length between D1 and D2 may be of the order of 1 mm. In an embodiment the variation between D1 and D2 is at least 20%, desirably at least 30%, or desirably more than 40%. In an embodiment the variation between D1 and D2 is less than 100%. In the case that air is supplied through the gas supply openings 61, the length D1, D2 may be much shorter (less than 1 mm). The variation between the distances D1 and D2 in percentage terms should however be the same as the embodiment where $CO_2$ is supplied out of the gas supply openings 61.

A distance between the extraction openings 210 and gas supply openings 61 may be 1-2 mm for the case that carbon dioxide is being provided out of the gas supply openings 61. The variation could be up to 1 mm and the percentages described above in relation to the variation in distances D1, D2 apply to the distance between the gas supply openings 61 and extraction openings 210. For the case where air is supplied through the gas supply openings 61, the distance separating the gas supply openings 61 and extraction openings 210 is less than 1 mm and the variation in distance in percentage terms is as described above.

The distance between the immersion fluid supply openings 180 and the openings 50 of the meniscus pinning feature may be about 2.5 mm. A variation in distance of 1 mm or even 1.5 mm can be employed. Therefore, in percentage terms a variation in distance between the openings 50 of the meniscus pinning feature and the immersion fluid supply openings 180 is more than 40%, desirably more than 50% or desirably more than 60%. The variation may be less than 200%.

In the case that $CO_2$ is being provided through the gas supply openings 61, the distance between the openings 50 of the meniscus pinning device, the gas supply openings 61 and extraction openings 210 may be greater than otherwise in order to ensure that the gas at the meniscus 320 has a high ratio of $CO_2$ to air (which could reach the meniscus 320 from outside of the fluid handling system). A flow rate of 60 liters/minute out of the openings 50 and extraction openings 210 and a flow rate out of the gas supply openings 61 of 90 liters/minute may be used. This may result in a $CO_2$ concentration of 99.9% at the meniscus 320.

The type of variation in the above and below embodiments is not limited to the forms hereinbefore described, For example, the variation may be a step change, a gradual change, a steadily increasing change, an increasing increase in change, etc.

Figure 12:
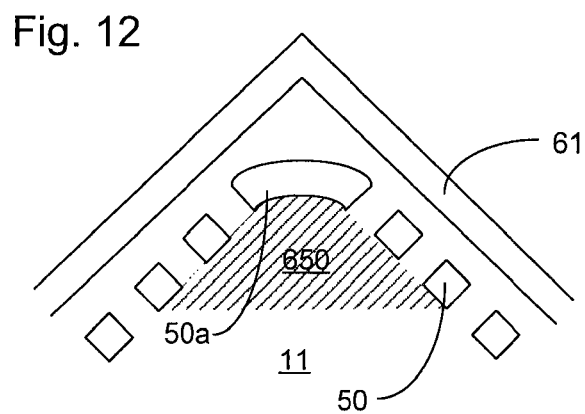
FIG. 12 depicts, in plan, a corner of a liquid supply system for use in a lithographic projection apparatus.

FIG. 12 illustrates an embodiment which can be used by itself or in combination with any of the measures described above with reference to FIGS. 8-11. In FIG. 12 the meniscus stabilization device is a portion 650 of an undersurface of the fluid handling structure has a surface with which the immersion liquid has a lower contact angle than portions of the undersurface of the fluid handling structure positioned at high radius parts. The lyophilic (hydrophilic in the case of water) nature of the undersurface of the fluid handling structure at portion 650 helps in keeping the meniscus 320 attached between openings 50 at the low radius part. The portion 650 may be within 3 mm, within 2 mm or within 1 mm of the corner or apex of the low radius part.

The undersurface of the fluid handling structure may be made lyophilic in any way. For example, this may be by way of surface treating the area 650 for example to make it less rough, i.e. smoother, than other areas. Additionally or alternatively a coating may be applied to the area 650, for example in the form of a layer applied or a sticker adhered to the undersurface. In an embodiment, a lyophobic (hydrophobic in the case of water) nature of the undersurface of the fluid handling structure may be provided, additionally or alternatively, between the openings 50 and the gas supply openings 61 opposite portion 650 at the openings 50 at the low radius part. This may helps in keeping the meniscus 320 attached between openings 50 at the low radius part. The lyophobic surface may be within 3 mm, within 2 mm or within 1 mm of the corner or apex of the low radius part.

In an embodiment additionally or alternatively the fluid handling structure has a fluid supply and/or recovery system 500 configured to supply and/or recover fluid from the openings present comprising one or all of the immersion fluid supply openings 180, openings 50, gas supply openings 61 and extraction openings 210. The system is configured to supply/recover fluid at a rate which is different depending upon the peripheral position. For example, at least one of the following conditions may be applied at a radial position corresponding to a low radius part compared to a high radius part: an increased flow rate of immersion fluid out of immersion fluid supply openings 180, a reduced flow rate of gas out of gas supply openings 61, and/or an increased flow rate into extraction openings 210. Therefore, the fluid supply and/or recovery system 500 provides/recovers fluid at different rates at the radial position corresponding to the low radius part.

At locations at radial positions corresponding to a high radius part or to a low radius part, the plurality of gas supply openings 61 are of a similar, e.g. the same, size. In an embodiment, the gas supply openings 61 are all within a percentage, e.g. 5%, of a pre-determined size. In an embodiment the plurality of gas supply openings 61 are arranged in a periodic pattern along a line. For example, the gas supply openings may be arranged in a repeating series of holes with different gaps between each of the holes in the series, for example two holes spaced closely apart followed by a gap and then two holes spaced closely apart followed by a gap, etc. In an embodiment the plurality of gas supply openings 61 are equidistantly spaced apart.

The immersion fluid supply openings 180 and extraction openings 210 may have similar properties to the plurality of gas supply openings 61 at radial positions corresponding to a high radius part or to a low radius part as described above in relation to the characteristics of the plurality of gas supply openings 61.

In the embodiments such as described with reference to FIGS. 8 and 9, a cross-sectional dimension of the gas supply openings 61 may be in the range of 100 µm to 200 µm, in diameter, desirably about 100 µm in diameter in the case of a circular openings or an equivalent open area ($7.8 \times 10^{-9}$ $m^2$). The distance between the centers of adjacent gas supply openings 61, or the pitch of adjacent gas supply openings 61, may be between 200 and 400 µm, desirably 200 and 300 µm. Such values give an open area of less than or equal to $10.0 \times 10^{-5}$ $m^2$ per meter length, desirably of less than or equal to $6.0 \times 10^{-5}$ $m^2$ per meter length, desirably less than or equal to $4.0 \times 10^{-5}$ $m^2$ or desirably less than or equal to $3.5 \times 10^{-5}$ $m^2$ per meter length. Desirably the open area per meter length is greater than or equal to $1.0 \times 10^{-5}$ $m^2$, or greater than or equal to $2.0 \times 10^{-5}$ $m^2$. By increasing the pitch or reducing the size of the opening the variation in open area at the other of the high radius part or low radius part is desirably at least 10%, desirably at least 15%, desirably at least 20%, or desirably at least 30%. A variation of at least 5% in average size of opening, desirably at least 10% or at least 15 or 20% is present. Making the variation in this order of magnitude may result in a significant drop in force on the meniscus 320 extending between the openings 50 while still maintaining the functionality of the gas supply openings 61 at the point where the variation is applied. Such variation of the dimensions of the gas supply openings, such as the open area per unit length, can desirably improve containment of the supplied carbon dioxide gas and/or immersion liquid.

If a variation is present in extraction openings 210, the variation should be of a similar or the same magnitude as described above with relation to the gas supply openings 61. The standard extraction opening 210 size is, as explained above, similar to that of a gas supply openings 61.

If a variation in the immersion fluid supply openings 180 is present, the variation should have a magnitude in percentage terms similar to that described above for the gas supply openings 61.

In the case of a variation in the width of a slit opening in an embodiment such as illustrated in FIG. 10, the width of the slit should vary by the percentages mentioned above with respect to the gas supply openings 61.

Figure 13:
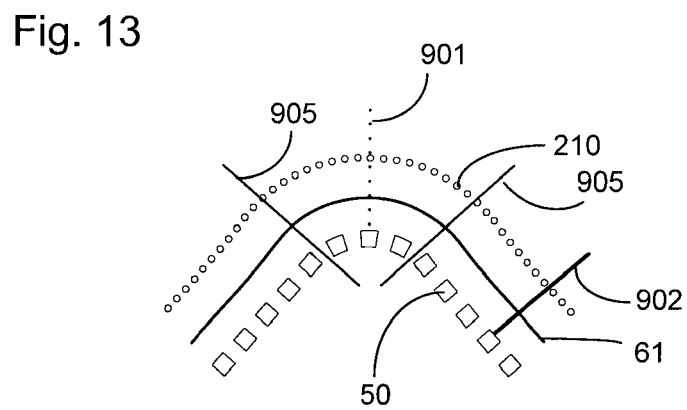
FIG. 13 depicts, in plan, a corner of a liquid supply system for use in a lithographic projection apparatus.
Figure 14:
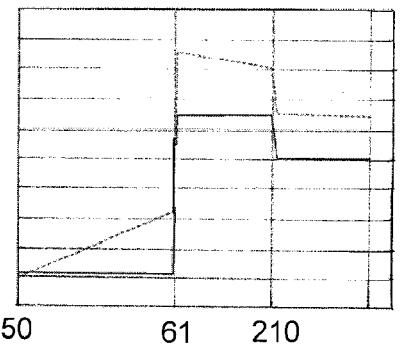
FIG. 14 is a graph showing radial velocity of gas on the y axis versus position on the x axis.
Figure 15:
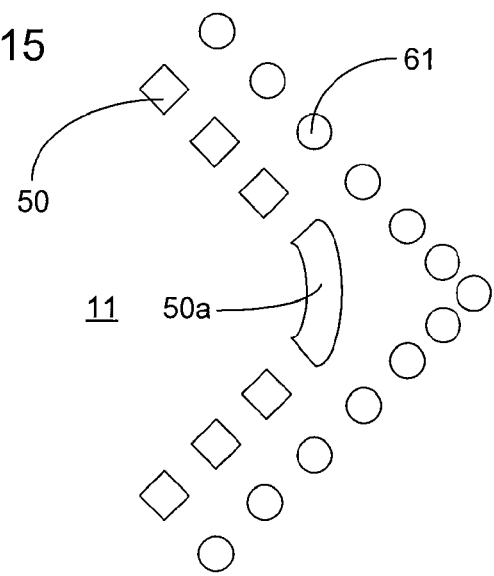
FIG. 15 depicts, in plan, a corner of a liquid supply system for use in a lithographic projection apparatus.

FIG. 13 illustrates an arrangement in which only openings 50 of a meniscus pinning feature and gas supply openings 61 are present. That is the slot opening 50a is absent. As described above the meniscus 600 may detach from the corner slot 50a as well as one or more neighboring openings 50. In using a meniscus pinning feature with openings 50 of substantially equal size, and without a slot opening 50a, the meniscus may be less likely to detach from the meniscus pinning feature. However the risk of a detaching meniscus still remains. A dashed line 901 indicates a low radius part and a solid line 902 indicates a high radius part. Lines 905 indicate the rough extent of the low radius part 901. Calculations have been made that assume that mass transport is tangentially constrained so that mass can only be transported radially. A resulting graph illustrated in FIG. 14 plots radial position on the x axis (with the positions of the openings 50 and gas supply openings 61 marked) and gas velocity (in the radial direction) on the y axis. The solid line indicates results for the high radius part and the dashed line indicates results for the low radius part. As can be seen, the relative flows per unit length are different at the high and low radius parts.

It may be optimal that the mean velocities of gas are similar around the periphery of the meniscus pinning feature. This could be accomplished by varying the flow out of the gas supply openings 61 and extraction openings 210 (if present) around the periphery of the space 11 using a specific fluid supply/recovery system. Additionally or alternatively a variation in the open area and/or in the distance between openings 50 of the meniscus pinning feature, gas supply openings 61 and extraction openings 210 can achieve the same or a similar effect.

The type of variations possible are the same as to those illustrated in FIGS. 8-11 and as described above.

Figure 21:
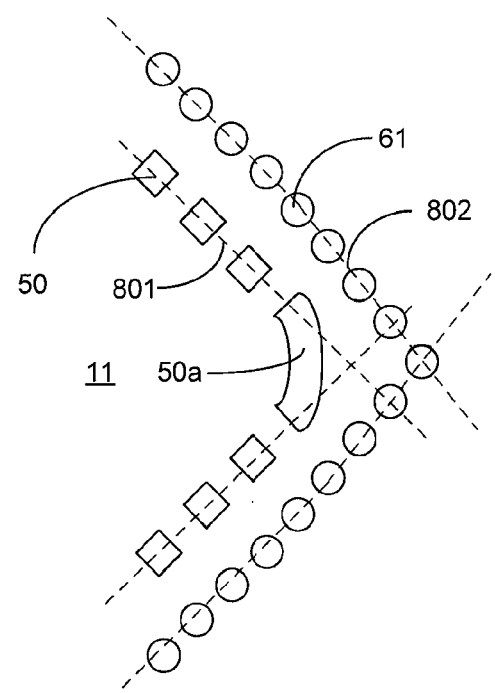
FIG. 21 depicts, in plan, a corner of a liquid supply system for use in a lithographic projection apparatus.

Other variations are possible such as: the pitch of the gas supply openings 61 is decreased at the position corresponding to the low radius part (FIG. 15); or increasing the number of gas supply openings 61 (FIG. 16) for example having two rows of openings associated with the corner; or increasing the size of the gas supply openings 61, i.e. the cross-section per unit length (FIG. 17); or increasing the width of a gas supply opening 61 in the form of a slit at the low radius part (FIG. 19); or the minimum distance between the linear arrays of the gas supply openings 61 and the meniscus pining feature is decreased at the low radius part (FIG. 21). These variations are illustrated in FIGS. 15, 16, 17, 19 and 21. For the extraction openings 210, if present, the changes could be opposite in sense (in addition or alternatively to the changes in the gas supply openings 61). These variations, in order to achieve the same effect as described with reference to the FIG. 8-11 embodiments, could be applied at the high radius parts rather than at the low radius parts as illustrated. Further, these arrangements could have openings 50 in the meniscus pinning feature, without a corner slot 50a, as shown in FIG. 13.

Figure 18:
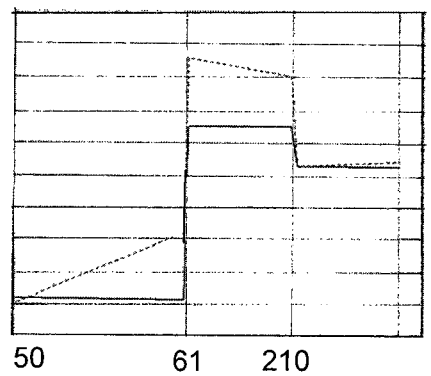
FIG. 18 is a graph showing radial velocity of gas on the y axis versus position on the x axis.
Figure 19:
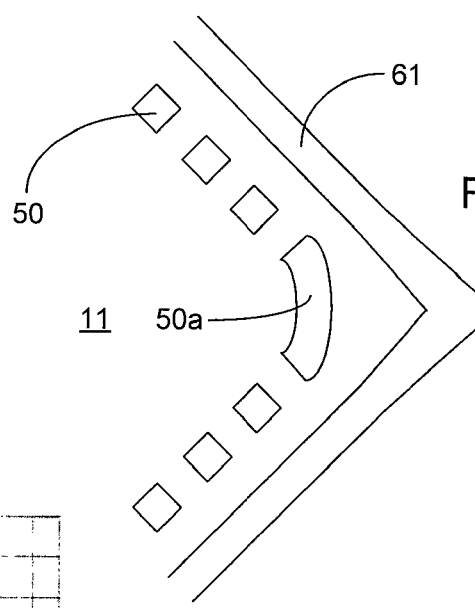
FIG. 19 depicts, in plan, a corner of a liquid supply system for use in a lithographic projection apparatus.
Figure 20:
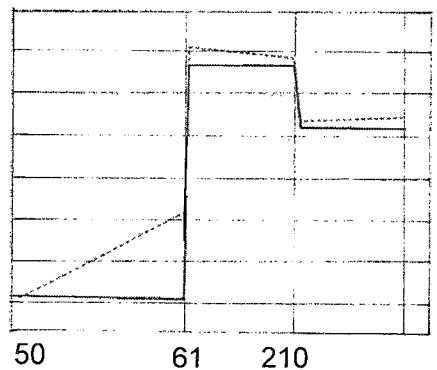
FIG. 20 is a graph showing radial velocity of gas on the y axis versus position on the x axis.

FIGS. 18 and 20 are graphs derived from the same calculations used to produce the graph shown in FIG. 14 except for certain differences. In the case of FIG. 18, the extraction openings 210 have a diameter of 100 μm except at the low radius part where the diameter is increased to 150 μm to remove extra gas. In the case of FIG. 20, a slit gas knife is used as illustrated in FIG. 19, for which the width at the high radius part is 35 μm and at the low radius part (i.e. at the corner) is 50 μm to reduce flow of gas at the corner. These results show an improvement in gas flow velocity at the corners and the sort of effects which can be achieved.

The amounts of variations in the embodiments of FIGS. 15-21 can be the same (though in the opposite direction) to the amounts of variations mentioned above in relation to the FIG. 8-11 embodiments.

Although the embodiments of FIGS. 8-11 appear to be contradictory to those of FIGS. 15-21, as with any other embodiment within those groups (e.g. FIGS. 8-11 and FIGS. 15-21), these two sets of embodiments may be combined in a single fluid handling structure. That is, there may be different areas around the periphery of the meniscus pinning feature, i.e. lengths or portions of the meniscus pining feature, which suffers from different problems which would benefit from the opposite changes (e.g. applying the variations of FIGS. 8-11 at the low radius parts and the variations of FIGS. 15-17, 19 and 21 at the high radius parts).

Although the variation has been described above as occurring at high radius parts and/or low radius parts, this is not necessarily the case and other criteria could be applied for determining where the variation takes place. One example, as described above, may be at a leading or trailing edge of the fluid handling structure which has an edge which is substantially co-planar with an elongate gap over which the leading or trailing edge passes during scanning of a substrate.

Additionally or alternatively it may be possible to address both problems if they occur at the same peripheral position at the meniscus pinning feature by choosing a combination of variations. For example, it is possible to increase the area of the gas supply openings at a low radius part while simultaneously moving the position of those gas supply openings 61 at the low radius part further away from the openings 50 of the meniscus pinning feature (a combination of the embodiments of FIGS. 17 and 11 respectively). For example, the distance between the immersion liquid supply openings 180 and the openings 50 can be reduced and the distance between the gas supply openings 61 and openings 50 can be reduced in the same embodiment.

Figure 22:
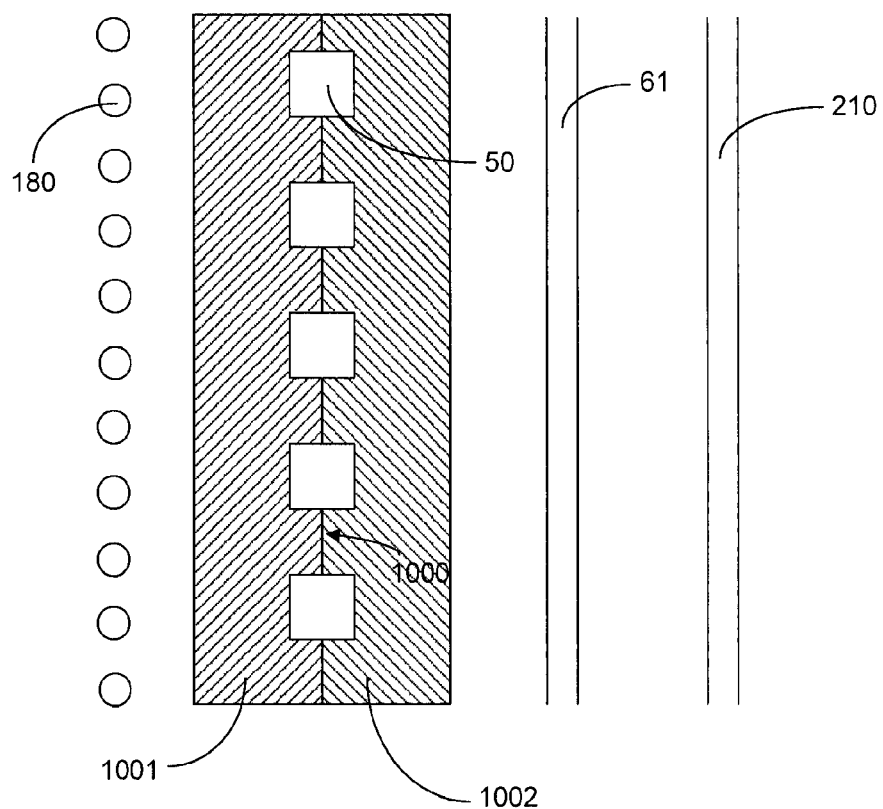
FIG. 22 depicts, in plan, a portion of a liquid supply system for use in a lithographic projection apparatus.
Figure 23:
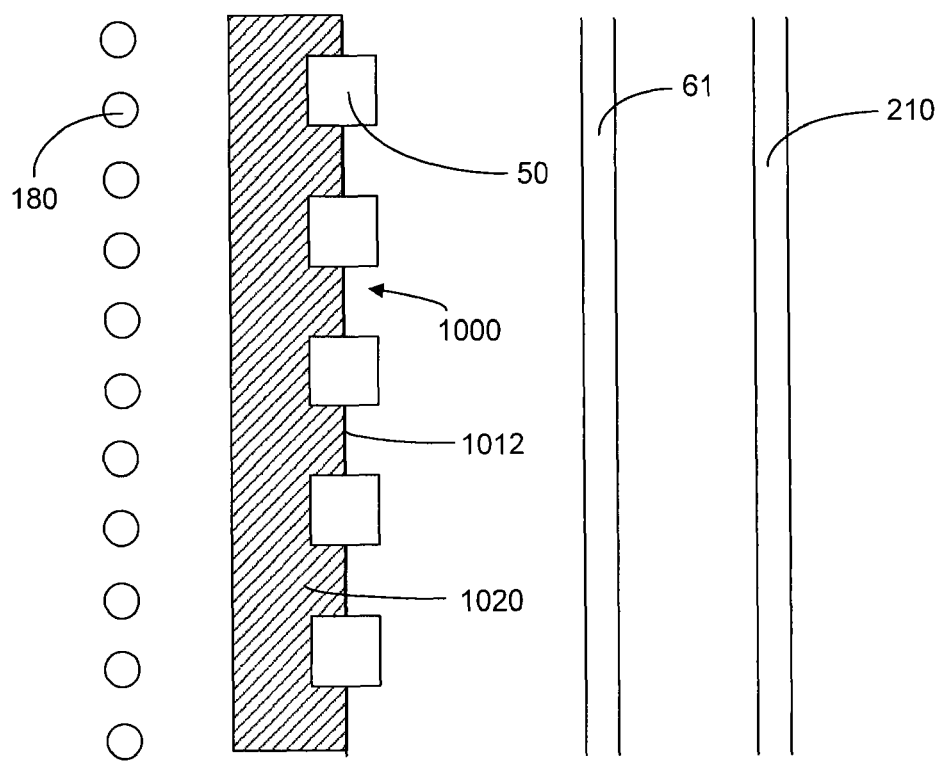
FIG. 23 depicts, in plan, a portion of a liquid supply system for use in a lithographic projection apparatus.

FIGS. 22 and 23 show a further measure which may be taken to stabilize the meniscus 320 which extends between adjacent openings 50 of the meniscus pinning feature. This embodiment may be implemented on its own or combined with any other embodiment including any combination of embodiments. In this embodiment a meniscus pinning device 1000 is on the undersurface of the fluid handling structure and extends between at least two of the openings 50. The meniscus pinning device 1000 desirably extends from a central portion of one opening to the central portion of an adjacent opening. For example the meniscus pinning feature may meet the opening 50 within the central 50% of the diameter of the opening 50, desirably within the central 40% or even 30%. The openings 180, 61 and 210 are optional and may be present in any combination. Openings 61, 180 and 210 may have the same function as described elsewhere herein. The opening 61 may be a single slit opening. The openings 61, 180 and 210 may be present or not and may be present in any combination.

The meniscus pinning device 1000 may be any sort of meniscus pinning device 1000. Desirably the meniscus pinning feature is a passive meniscus pinning feature in that it requires no moving parts or fluid flow to be provided to it. In the example of FIG. 22 the meniscus pinning device 1000 comprises a step change in surface property, for example a change in roughness from area 1001 to 1002 and/or a change in surface property which results in a different contact angle between the immersion liquid and the undersurface of the fluid handling structure between areas 1001 and 1002.

In FIG. 23 the meniscus pinning device 1000 is provided by an edge 1012. Desirably the edge 1012 is such that the radially outer portion of undersurface of the fluid handling structure is, in use, closer to the facing surface (e.g. substrate W) than the radially inner undersurface of the fluid handling structure. In this way the open area of each opening 50 which is radially inwards, and therefore facing the liquid in the space 11, is greater than the area of the opening open to gas (assuming that half the diameter of the opening is wet, on average).

The height of the edge may, for example, be about 30 microns, for example between 10 and 50 microns.

The edge may in fact be the edge of a recess or groove 1020, as illustrated. The groove 1020 desirably extends radially inwardly of the plurality of openings 50 such that the advantage of larger open area of the openings 50 to liquid than gas is present.

Providing a meniscus pinning feature 1000 between adjacent openings 50 may result in a straightening of the meniscus 320 and thereby a smoothing of liquid flow into the openings 50. This results in a more stable meniscus which results in lower defectivity. It increases the possibility of higher scan speeds.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; a gas supply opening at least partly surrounding and radially outward of the meniscus pinning feature; and optionally a gas recovery opening radially outward of the gas supply opening, wherein the gas supply opening, or the gas recovery opening, or both the gas supply opening and the gas recovery opening, has an open area per meter length which has a variation peripherally around the space.

In an embodiment, wherein the variation is at least partly achieved by changing a width of an opening. In an embodiment, the variation is at least partly achieved by changing a number of openings per unit peripheral length. In an embodiment, the gas supply opening comprises a plurality of gas supply openings in a linear array and/or the gas recovery opening comprises a plurality of gas recovery openings in a linear array. In an embodiment, the variation is at least partly achieved by a change in a pitch between adjacent openings, optionally changing the number of openings per unit peripheral length. In an embodiment, the variation is at least partly achieved by changing a number of rows of openings, optionally changing the number of openings per unit peripheral length. In an embodiment, the variation in open area is a variation in size of opening by at least 5% of an average size of opening, by at least 10%, by at least 15%, or by at least 20%. In an embodiment, the variation in open area is a variation of at least 10%, at least 15%, at least 20% or at least 30%. In an embodiment, the meniscus pinning feature has, in plan, a cornered shape with a low radius part with a first radius of curvature at a corner and a high radius part distant from the corner with a second radius of curvature which is higher than the first radius of curvature, and the variation in open area occurs between a radial position corresponding to a low radius part and a radial position corresponding to a high radius part. In an embodiment, the variation in open area is an increase at the low radius part. In an embodiment, the variation in open area is a decrease at the low radius part. In an embodiment, the fluid handling structure further optionally comprises an immersion fluid supply opening radially inward of the meniscus pinning feature, wherein a distance between at least one selected from the following: (i) a line passing along the immersion fluid supply opening and a line passing along the meniscus pinning feature; (ii) a line passing along the meniscus pinning feature and a line passing along the gas supply opening; and/or (iii) a line passing along the gas supply opening and a line passing along the gas recovery opening, varies peripherally around the space. In an embodiment, the meniscus pinning feature has, in plan, a cornered shape with a low radius part with a first radius of curvature at a corner and a high radius part distant from the corner with a second radius of curvature which is higher than the first radius of curvature; and the variation in distance occurs between a radial position corresponding to a low radius part and a radial position corresponding to a high radius part. In an embodiment, the variation in distance is an increase at the low radius part. In an embodiment, the variation in distance is a decrease at the low radius part.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; a gas supply opening at least partly surrounding and radially outward of the meniscus pinning feature; and optionally one or both of (a) a gas recovery opening radially outward of the gas supply opening and/or (b) an immersion fluid supply opening radially inward of the meniscus pinning feature, wherein a distance between at least one selected from the following: (i) a line passing along the immersion fluid supply opening and a line passing along the meniscus pinning feature; (ii) a line passing along the meniscus pinning feature and a line passing along the gas supply opening; and/or (iii) a line passing along the gas supply opening and a line passing along the gas recovery opening, varies peripherally around the space.

In an embodiment, the meniscus pinning feature has, in plan, a cornered shape with a low radius part with a first radius of curvature at a corner and a high radius part distant from the corner with a second radius of curvature which is higher than the first radius of curvature; and the variation in distance occurs between a radial position corresponding to a low radius part and a radial position corresponding to a high radius part. In an embodiment, the variation in distance is an increase. In an embodiment, the variation in distance is a decrease. In an embodiment, the fluid handling structure further comprises a gas supply configured to supply gas to each of a plurality of gas supply openings at the same pressure. In an embodiment, the fluid handling structure further comprises a gas recovery system configured to apply a same underpressure to each of a plurality of gas recovery openings. In an embodiment, the variation in distance is at least 20%, at least 30%, at least 40% or at least 50% of a lowest minimum distance.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space, wherein the meniscus pinning feature has, in plan, a cornered shape with a low radius part with a first radius of curvature at a corner and a high radius part distant from the corner with a second radius of curvature which is higher than the first radius of curvature, and a contact angle of immersion liquid to the fluid handling structure in a region at the low radius part is lower than the contact angle of immersion liquid to the fluid handling structure in a region at the high radius part.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; and optionally at least one selected from the following: (a) a gas supply opening at least partly surrounding and radially outward of the meniscus pinning feature; (b) a gas recovery opening radially outward of the gas supply opening; and/or (c) an immersion fluid supply opening radially inward of the meniscus pinning feature, wherein the meniscus pinning feature has, in plan, a cornered shape with a low radius part with a first radius of curvature at a corner and a high radius part distant from the corner with a second radius of curvature which is higher than the first radius of curvature, and a fluid supply and/or recovery system configured to supply and/or recover fluid to/from at least one selected from the following: (a) the gas supply opening, (b) the meniscus pinning feature, (c) the gas recovery opening, and/or (d) the immersion fluid supply opening, at a different rate at a peripheral position corresponding to the high radius part than to a peripheral position corresponding to the low radius part.

In an embodiment, the meniscus pinning feature comprises a plurality of openings in a linear array. In an embodiment, the meniscus pinning feature comprises a single phase extractor.

In an embodiment, there is provided a fluid handling structure for a lithographic apparatus, the fluid handling structure being configured to contain immersion fluid to a space, the fluid handling structure having in an undersurface: a plurality of fluid recovery openings at least partly surrounding the space to resist passage of immersion fluid in a radially outward direction from the space; and a meniscus pinning device extending between at least two of the plurality of fluid recovery openings.

In an embodiment, the meniscus pinning device is an edge. In an embodiment, the edge is an edge of a recess in the undersurface. In an embodiment, the recess extends radially inwardly of the plurality of fluid recovery openings. In an embodiment, the meniscus pinning device extends from substantially a central portion of one of at least two of the plurality of fluid recovery openings to a central portion of one of the other of the at least two of the plurality of fluid recovery openings.

In an embodiment, there is provided an immersion lithographic apparatus, the apparatus comprising the fluid handling structure described herein.

In an embodiment, there is provided a device manufacturing method, comprising: projecting a patterned beam of radiation through an immersion liquid confined to a space between a projection system and a substrate; providing gas through a gas supply opening to a position adjacent a meniscus of the immersion liquid; and optionally recovering gas which passes through the gas supply opening through a gas recovery opening radially outward of the gas supply opening, wherein the gas supply opening, or the gas recovery opening, or both the gas supply opening and the gas recovery opening, has an open area per meter length which has a variation peripherally around the space.

In an embodiment, there is provided a device manufacturing method, comprising: projecting a patterned beam of radiation through an immersion liquid confined to a space between a projection system and a substrate; providing gas through a gas supply opening to a position adjacent a meniscus of the immersion liquid, the passage of the meniscus being resisted by a meniscus pinning feature; and optionally one or both of: (a) recovering gas which passes through the gas supply opening through a gas recovery opening radially outward of the gas supply opening; and/or (b) providing immersion fluid to the space through an immersion fluid supply opening radially inward of the meniscus pinning feature, wherein a distance between at least one selected from the following: (i) a line passing along the immersion fluid supply opening and a line passing along the meniscus pinning feature; (ii) a line passing along the immersion pinning feature and a line passing along the gas supply opening; and/or (iii) a line passing along the gas supply opening and a line passing along the gas recovery opening, varies peripherally around the space.

In an embodiment, there is provided a device manufacturing method, comprising: projecting a patterned beam of radiation through an immersion liquid confined to a space between a projection system and a substrate; providing gas through an opening to a position adjacent a meniscus of the immersion liquid, the passage of the meniscus being resisted by a meniscus pinning feature, wherein the meniscus pinning feature has, in plan, a cornered shape with a low radius part with a first radius of curvature at a corner and a high radius part distant from the corner with a second radius of curvature which is higher than the first radius of curvature, and wherein a contact angle of immersion liquid to the fluid handling structure in a region at the low radius part is lower than the contact angle of immersion liquid to the fluid handling structure in a region at the high radius part.

In an embodiment, there is provided a device manufacturing method, comprising: projecting a patterned beam of radiation through an immersion liquid confined to a space between a projection system and a substrate by a meniscus pinning feature; and optionally one or more selected from the following: (a) providing gas through a gas supply opening radially outward of the meniscus pinning feature, (b) recovering gas which passes through the gas supply opening through a gas recovery opening radially outward of the gas supply opening, and/or (c) providing immersion fluid to the space through an immersion fluid supply opening radially inward of the meniscus pinning feature, wherein the meniscus pinning feature has, in plan, a cornered shape with a low radius part with a first radius of curvature at a corner and a high radius part distant from the corner with a second radius of curvature which is higher than the first radius of curvature, wherein fluid is supplied and/or recovered to/from at least one selected from the following: (a) the gas supply opening, (b) the meniscus pinning feature, (c) the gas recovery opening, and/or (d) the immersion fluid supply opening, at a different rate at a peripheral position corresponding to the high radius part than to a peripheral position corresponding to the low radius part.

In an embodiment, there is provided a device manufacturing method comprising: projecting a patterned beam of radiation through an immersion liquid confined to a space between a projection system and a substrate; and recovering fluid through a plurality of fluid recovery openings at least partly surrounding the space to resist the passage of a meniscus of liquid in a radially outward direction from the space in combination with a meniscus pinning feature extending between at least two of the plurality of fluid recovery openings.

In an embodiment, there is provided a device manufacturing method, comprising: projecting a patterned beam of radiation through an immersion liquid confined to a space between a projection system and a substrate; and directing a gas to a position adjacent a meniscus of the immersion liquid in the space at a speed which varies around the periphery of the space.

In an embodiment, there is provided a fluid handling structure for a lithographic apparatus, the fluid handling structure having, at a boundary of a space configured to contain immersion fluid to a region external to the fluid handling structure, the boundary comprising at least one corner in a plane parallel to an undersurface of the fluid handling structure: a meniscus pinning feature to resist passage of immersion fluid in a radially outward direction from the space; and a meniscus stabilization device configured to improve stability of the meniscus pinning at the corner.

As will be appreciated, any of the above described features can be used with any other feature and it is not only those combinations explicitly described which are covered in this application. For example, an embodiment of the invention could be applied to the embodiments of FIGS. 2 to 4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

An embodiment of the invention may be applied to substrates with a diameter of 300 mm or 450 mm or any other size.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or readheads that cooperate with the scale(s) or grid(s) to determine the position, velocity, etc. of the component.

In an embodiment, the lithographic apparatus comprises a liquid confinement structure that has a liquid removal device (or meniscus pinning feature) having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure comprising:
    a meniscus pinning feature to resist passage of immersion fluid in a radially outward direction from a space configured to contain immersion fluid; and
    a gas supply opening, outward relative to the space of the meniscus pinning feature, at least partly surrounding the meniscus pinning feature,
    wherein the gas supply opening has an open area per meter length which has a variation peripherally around the space at least partly achieved by a change in a width of an opening of the gas supply opening and/or at least partly achieved by having a first plurality of side-by-side openings of the gas supply opening arranged along a direction having a first pitch different than a second pitch of a different second plurality of side-by-side openings of the gas supply opening arranged along the direction, the first plurality of openings being side-by-side along the direction with the second plurality of openings.

2. The fluid handling structure of claim 1, comprising the variation being at least partly achieved by the change in the width of the opening.

3. The fluid handling structure of claim 1, wherein the variation is at least partly achieved by a change of a number of openings per unit peripheral length.

4. The fluid handling structure of claim 1, wherein the gas supply opening comprises a plurality of gas supply openings in a linear array.

5. The fluid handling structure of claim 1, comprising the variation being at least partly achieved by having the first plurality of side-by-side openings of the gas supply opening arranged along the direction having the first pitch different than the second pitch of the different second plurality of side-by-side openings of the gas supply opening arranged along the direction, the first plurality of openings being side-by-side along the direction with the second plurality of openings.

6. The fluid handling structure of claim 1, wherein the variation is at least partly achieved by a change of a number of rows of openings.

7. The fluid handling structure of claim 1, wherein the meniscus pinning feature has, in plan, a cornered shape with a low radius part with a first radius of curvature at a corner and a high radius part distant from the corner with a second radius of curvature which is higher than the first radius of curvature, and the variation in open area occurs between a radial position corresponding to a low radius part and a radial position corresponding to a high radius part.

8. The fluid handling structure of claim 7, wherein the variation in open area is an increase at the low radius part.

9. The fluid handling structure of claim 7, wherein the variation in open area is a decrease at the low radius part.

10. The fluid handling structure of claim 1, wherein a distance between a line passing along the meniscus pinning feature and a line passing along the gas supply opening varies peripherally around the space.

11. The fluid handling structure of claim 10, wherein the meniscus pinning feature has, in plan, a cornered shape with a low radius part with a first radius of curvature at a corner and a high radius part distant from the corner with a second radius of curvature which is higher than the first radius of curvature; and
    the variation in distance occurs between a radial position corresponding to a low radius part and a radial position corresponding to a high radius part.

12. The fluid handling structure of claim 11, wherein the variation in distance is an increase at the low radius part.

13. The fluid handling structure of claim 1, further comprising a gas supply configured to supply gas to each of a plurality of gas supply openings at the substantially same pressure.

14. The fluid handling structure of claim 1, further comprising a plurality of gas recovery openings radially outward of the gas supply opening and a gas recovery system configured to apply a substantially same underpressure to each of the plurality of gas recovery openings.

15. The fluid handling structure of claim 1, wherein the meniscus pinning feature comprises a plurality of openings in a linear array.

16. The fluid handling structure of claim 1, wherein the meniscus pinning feature comprises a single phase extractor.

17. A fluid handling structure for a lithographic apparatus, the fluid handling structure comprising:
    a meniscus pinning feature to resist passage of immersion fluid in a radially outward direction from a space configured to contain immersion fluid; and
    a gas supply opening, outward relative to the space of the meniscus pinning feature, at least partly surrounding the meniscus pinning feature,
    wherein a distance between a line passing along the meniscus pinning feature and a line passing along the gas supply opening varies, and
    wherein the gas supply opening has an open area per meter length which has a variation peripherally around the space at least partly achieved by a change in a width of an opening of the gas supply opening and/or at least partly achieved by having a first plurality of side-by-side openings of the gas supply opening arranged along a direction having a first pitch different than a second pitch of a different second plurality of side-by-side openings of the gas supply opening arranged along the direction, the first plurality of openings being side-by-side along the direction with the second plurality of openings.

18. A fluid handling structure for a lithographic apparatus, the fluid handling structure comprising:
a meniscus pinning feature to resist passage of immersion fluid in a radially outward direction from a space configured to contain immersion fluid; and
a gas supply opening, outward relative to the space of the meniscus pinning feature, at least partly surrounding the meniscus pinning feature,
wherein the meniscus pinning feature has, in plan, a cornered shape with a low radius part with a first radius of curvature at a corner and a high radius part distant from the corner with a second radius of curvature which is higher than the first radius of curvature, and a contact angle of immersion liquid to the fluid handling structure in a region at the low radius part is lower than the contact angle of immersion liquid to the fluid handling structure in a region at the high radius part, and
wherein the gas supply opening has an open area per meter length which has a variation peripherally around the space at least partly achieved by a change in a width of an opening of the gas supply opening and/or at least partly achieved by having a first plurality of side-by-side openings of the gas supply opening arranged along a direction having a first pitch different than a second pitch of a different second plurality of side-by-side openings of the gas supply opening arranged along the direction, the first plurality of openings being side-by-side along the direction with the second plurality of openings.

19. An immersion lithographic apparatus, the apparatus comprising:
a substrate table configured to hold a substrate;
a projection system configured to project a patterned beam of radiation onto the substrate; and
a liquid supply system configured to provide an immersion fluid to a space between the projection system and the substrate table, the liquid supply system comprising a fluid handling structure, the fluid handling structure comprising:
a meniscus pinning feature to resist passage of immersion fluid in a radially outward direction from the space, and
a gas supply opening, outward relative to the space of the meniscus pinning feature, at least partly surrounding the meniscus pinning feature,
wherein the gas supply opening has an open area per meter length which has a variation peripherally around the space at least partly achieved by a change in a width of an opening of the gas supply opening and/or at least partly achieved by having a first plurality of side-by-side openings of the gas supply opening arranged along a direction having a first pitch different than a second pitch of a different second plurality of side-by-side openings of the gas supply opening arranged along the direction, the first plurality of openings being side-by-side along the direction with the second plurality of openings.

20. A device manufacturing method, comprising:
projecting a patterned beam of radiation through an immersion liquid confined to a space between a projection system and a substrate; and
providing gas through a gas supply opening to a position adjacent a meniscus of the immersion liquid,
wherein the gas supply opening has an open area per meter length which has a variation peripherally around the space at least partly achieved by a change in a width of an opening of the gas supply opening and/or at least partly achieved by having a first plurality of side-by-side openings of the gas supply opening arranged along a direction having a first pitch different than a second pitch of a different second plurality of side-by-side openings of the gas supply opening arranged along the direction, the first plurality of openings being side-by-side along the direction with the second plurality of openings.

* * * * *